(12) United States Patent
Ishizaka et al.

(10) Patent No.: US 8,242,019 B2
(45) Date of Patent: Aug. 14, 2012

(54) SELECTIVE DEPOSITION OF METAL-CONTAINING CAP LAYERS FOR SEMICONDUCTOR DEVICES

(75) Inventors: Tadahiro Ishizaka, Kofu (JP); Shigeru Mizuno, Delmar, NY (US); Satohiko Hoshino, Delmar, NY (US); Hiroyuki Nagai, Clifton Park, NY (US); Yuki Chiba, Rensselaer, NY (US); Frank M. Cerio, Jr., Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/414,917

(22) Filed: Mar. 31, 2009

(65) Prior Publication Data

US 2010/0248473 A1    Sep. 30, 2010

(51) Int. Cl.
H01L 21/44    (2006.01)
H01L 21/4763  (2006.01)
H01L 21/302   (2006.01)

(52) U.S. Cl. ........ 438/686; 438/618; 438/622; 438/637; 438/660; 438/678; 438/689

(58) Field of Classification Search .................. None
See application file for complete search history.

(56) References Cited

U.S. PATENT DOCUMENTS

| | | | |
|---|---|---|---|
| 5,358,743 A | 10/1994 | Hampden-Smith et al. | |
| 7,270,848 B2 | 9/2007 | Suzuki et al. | |
| 7,790,635 B2 | 9/2010 | Balseanu et al. | |
| 2002/0017641 A1 | 2/2002 | Lu et al. | |
| 2003/0173671 A1 | 9/2003 | Hironaga et al. | |
| 2004/0152255 A1 | 8/2004 | Seidl et al. | |
| 2004/0166674 A1* | 8/2004 | Chen et al. ............ | 438/687 |
| 2006/0121733 A1 | 6/2006 | Kilpela et al. | |
| 2007/0099420 A1 | 5/2007 | Dominguez et al. | |
| 2007/0184655 A1* | 8/2007 | Learn et al. ............ | 438/687 |
| 2007/0197023 A1* | 8/2007 | Widodo et al. ......... | 438/627 |
| 2007/0267723 A1* | 11/2007 | Bernstein et al. ....... | 257/621 |
| 2007/0269976 A1 | 11/2007 | Futase et al. | |
| 2007/0273044 A1* | 11/2007 | Yang et al. ............ | 257/775 |
| 2008/0042283 A1* | 2/2008 | Purushothaman et al. ... | 257/754 |
| 2008/0150131 A1 | 6/2008 | Ruan et al. | |
| 2008/0315426 A1* | 12/2008 | Yang et al. ............ | 257/769 |
| 2008/0315429 A1* | 12/2008 | McFeely et al. ........ | 257/773 |
| 2009/0065939 A1 | 3/2009 | Suzuki | |
| 2009/0170314 A1 | 7/2009 | Morinaga et al. | |
| 2009/0186481 A1 | 7/2009 | Suzuki et al. | |
| 2009/0189287 A1 | 7/2009 | Yang et al. | |
| 2009/0197405 A1* | 8/2009 | Besling et al. ......... | 438/653 |

(Continued)

OTHER PUBLICATIONS

U.S. Patent and Trademark Office, International Search Report and Written Opinion received for International Application No. PCT/US11/30115 dated May 25, 2011, 19 pp.

(Continued)

*Primary Examiner* — Nathan Ha
*Assistant Examiner* — Michael Jung

(57) ABSTRACT

A method for integrating metal-containing cap layers into copper (Cu) metallization of semiconductor devices. In one embodiment, the method includes providing a patterned substrate containing metal surfaces and dielectric layer surfaces, and modifying the dielectric layer surfaces by exposure to a reactant gas containing a hydrophobic functional group, where the modifying substitutes a hydrophilic functional group in the dielectric layer surfaces with a hydrophobic functional group. The method further includes depositing metal-containing cap layers selectively on the metal surfaces by exposing the modified dielectric layer surfaces and the metal surfaces to a deposition gas containing metal-containing precursor vapor.

9 Claims, 16 Drawing Sheets

U.S. PATENT DOCUMENTS

| | | |
|---|---|---|
| 2009/0250815 A1* | 10/2009 | Yang et al. .................... 257/750 |
| 2010/0015798 A1 | 1/2010 | Suzuki et al. |
| 2010/0029071 A1* | 2/2010 | Russell et al. ................ 438/514 |
| 2010/0081274 A1 | 4/2010 | Ishizaka et al. |
| 2010/0197135 A1* | 8/2010 | Ishizaka ........................ 438/653 |
| 2010/0210108 A1* | 8/2010 | Ishizaka et al. ............... 438/674 |

OTHER PUBLICATIONS

U.S. Patent and Trademark Office, Non-final Office Action issued on Sep. 15, 2011 for U.S. Appl. No. 12/749,792, 11 pp.

* cited by examiner

SELECTIVE DEPOSITION OF METAL-CONTAINING CAP LAYERS FOR SEMICONDUCTOR DEVICES

FIELD OF THE INVENTION

The present invention relates to semiconductor processing and semiconductor devices, and more particularly, to methods for integrating metal-containing cap layers into copper (Cu) metallization of semiconductor devices to improve electromigration (EM) and stress migration (SM) in bulk Cu metal.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. A "via" normally refers to any recessed feature such as a hole, line or other similar feature formed within a dielectric layer that, when filled with metal, provides an electrical connection through the dielectric layer to a conductive layer underlying the dielectric layer. Similarly, recessed features connecting two or more vias are normally referred to as trenches.

The use of Cu metal in multilayer metallization schemes for manufacturing integrated circuits has created several problems that require solutions. For example, high mobility of Cu atoms in dielectric materials and silicon(Si) can result in migration of Cu atoms into those materials, thereby forming electrical defects that can destroy an integrated circuit. Therefore, Cu metal layers, Cu filled trenches, and Cu filled vias are normally encapsulated with a barrier layer to prevent Cu atoms from diffusing into the dielectric materials. Barrier layers are normally deposited on trench and via sidewalls and bottoms prior to Cu deposition, and may include materials that are preferably non-reactive and immiscible in Cu, provide good adhesion to the dielectrics materials and can offer low electrical resistivity.

The electrical current density in an integrated circuit's interconnects significantly increases for each successive technology node due to decreasing minimum feature sizes. Because electromigration (EM) and stress migration (SM) lifetimes are inversely proportional to current density, EM and SM have fast become critical challenges. EM lifetime in Cu dual damascene interconnect structures is strongly dependent on atomic Cu transport at the interfaces of bulk Cu metal and surrounding materials which is directly correlated to adhesion at these interfaces. New materials that provide better adhesion and better EM lifetime have been studied extensively. For example, a cobalt-tungsten-phosphorus (COWP) layer has been selectively deposited on bulk Cu metal using an electroless plating technique. The interface of COWP and bulk Cu metal has superior adhesion strength that yields longer EM lifetime. However, maintaining acceptable deposition selectivity on bulk Cu metal, especially for tight pitch Cu wiring, and maintaining good film uniformity, has affected acceptance of this complex process. Furthermore, wet process steps using acidic solution may be detrimental to the use of CoWP.

Therefore, new methods are required for depositing metal-containing cap layers that provide good adhesion to Cu metal and improved EM and SM properties of bulk Cu metal. In particular, these methods should provide good selectivity for forming the metal-containing cap layers on Cu metal surfaces compared to dielectric layer surfaces.

SUMMARY OF THE INVENTION

Embodiments of the invention provide methods for manufacturing semiconductor devices by integrating metal-containing cap layers into Cu metallization to improve electromigration and stress migration in bulk Cu metal layers. The methods provide improved selective deposition of metal-containing cap layers on patterned substrates containing metal surfaces and dielectric layer surfaces by modifying the dielectric layer surfaces prior to depositing the metal-containing cap layers selectively on the metal surfaces.

According to one embodiment of the invention, the method includes providing a patterned substrate containing metal surfaces and dielectric layer surfaces and modifying the dielectric layer surfaces by exposure to a reactant gas containing a hydrophobic functional group, where the modifying substitutes a hydrophilic functional group in the dielectric layer surfaces with the hydrophobic functional group. The method further includes depositing metal-containing cap layers selectively on the metal surfaces by exposing the modified dielectric layer surfaces and the metal surfaces to a deposition gas containing metal-containing precursor vapor.

According to another embodiment of the invention, the method includes providing a patterned substrate containing a dielectric layer having first dielectric layer surfaces, where the patterned substrate further contains metal surfaces inside recessed features in the dielectric layer. The method further includes modifying the first dielectric layer surfaces by exposure to a first silicon-containing reactant gas containing a hydrophobic functional group, the modifying substituting a hydrophilic functional group in the first dielectric layer surfaces with the hydrophobic functional group, and depositing first Ru metal cap layers selectively on the metal surfaces by exposing the modified first dielectric layer surfaces and the metal surfaces to a first deposition gas containing $Ru_3(CO)_{12}$ precursor vapor and CO carrier gas. According to another embodiment, the method further includes removing the hydrophobic functional group from the modified first dielectric layer surfaces, filling the recessed features with a Cu metal layer, and planarizing the Cu metal layer to form Cu metal surfaces and second dielectric layer surfaces. The method still further includes modifying the second dielectric layer surfaces by exposure to a second silicon-containing reactant gas containing a hydrophobic functional group, the modifying substituting a hydrophilic functional group in the second dielectric layer surfaces with the hydrophobic functional group, and depositing second Ru metal cap layers selectively on the Cu metal surfaces by exposing the modified second dielectric layer surfaces and the Cu metal surfaces to a second deposition gas containing $Ru_3(CO)_{12}$ vapor and CO carrier gas.

According to yet another embodiment of the invention, the method includes providing a patterned substrate containing Cu metal surfaces and dielectric layer surfaces, modifying the dielectric layer surfaces by exposure to a silicon-containing reactant gas containing a hydrophobic functional group, the modifying substituting a hydrophilic functional group in the dielectric layer surfaces with the hydrophilic functional group, and forming Ru metal cap layers selectively on the Cu metal surfaces by exposing the modified dielectric layer surfaces and the Cu metal surfaces to a deposition gas containing $Ru_3(CO)_{12}$ vapor and CO carrier gas.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Figure 1A:
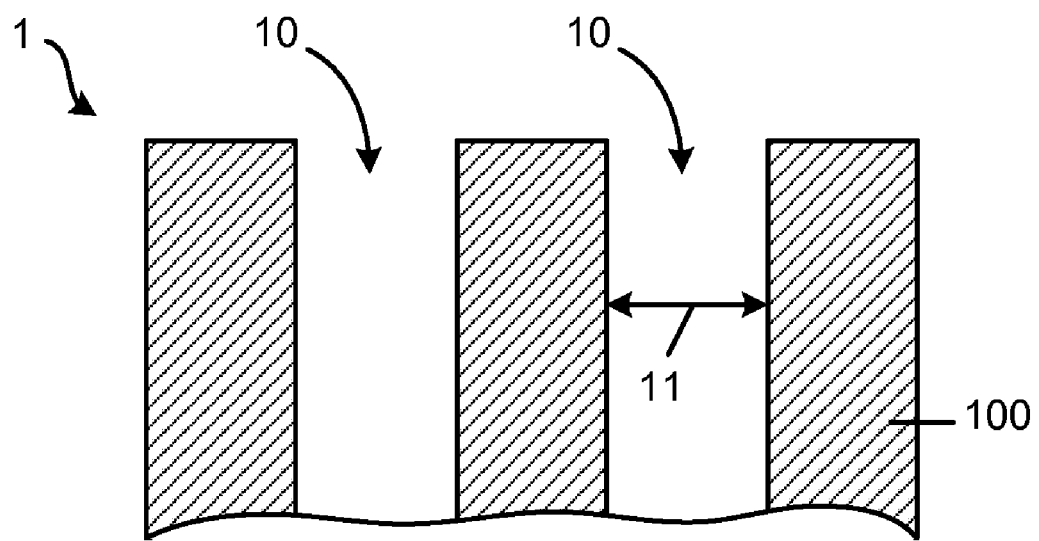
FIGS. 1A-1J show schematic cross-sectional views of formation of metal-containing cap layers in Cu metallization of a semiconductor device according to embodiments of the invention.

Embodiments of the invention provide methods for integrating metal-containing cap layers into Cu metallization of semiconductor devices to improve electromigration and stress migration in the devices. Although the presence of metal-containing cap layers on metal surfaces (e.g., Cu surfaces or tungsten (W) surfaces) in semiconductor devices is extremely beneficial to the electromigration and stress migration properties of the Cu metallization layers, the presence of even trace amounts of additional metal-containing material on dielectric layer surfaces adjacent the metal layers is detrimental to the various electrical properties of a semiconductor device.

As the minimum feature sizes of semiconductor devices decrease and the thickness of the dielectric layers between adjacent metal layers decreases, electromigration and stress migration problems become increasingly more serious. In one example, a 32 nm minimum feature size device generation may utilize only about 45-50 nm dielectric thickness between adjacent metal layers, and trace amounts of additional metal-containing material on the dielectric layer surfaces can create a current leakage path between the adjacent metal layers, and strongly effect current (I)-voltage (V) and time-dependent-dielectric-breakdown (TDDB) behavior of the semiconductor devices.

Embodiments of the invention provide a method for forming metal-containing cap layers on patterned substrates containing metal surfaces and dielectric layer surfaces. The method includes exposing the patterned substrate to a reactant gas containing hydrophobic functional groups to modify the dielectric layer surfaces. The modifying forms hydrophobic dielectric layer surfaces by substituting hydrophilic functional groups in the dielectric layer surfaces with hydrophobic functional groups from the reactant gas. Subsequent exposure to a deposition gas containing metal-containing precursor vapor selectively deposits metal-containing cap layers on the metal surfaces but hydrophobic functional groups in the dielectric layer surfaces prevent or minimize deposition of additional metal-containing material by removing adsorption sites for the metal-containing precursor on the dielectric layer surfaces. This results in improved selective formation of metal-containing cap layers on the metal surfaces relative to on the modified dielectric layer surfaces.

One skilled in the relevant art will recognize that the various embodiments may be practiced without one or more of the specific details, or with other replacement and/or additional methods, materials, or component. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessary drawn to scale.

Reference throughout this specification to "one embodiment" means that a particular feature, structure, material, or characteristic described in connection with the embodiment is included in at least one embodiment of the invention, but do not denote that they are present in every embodiment. Thus, the appearances of the phrases "one embodiment" or "in an embodiment" in various places throughout this specification are not necessarily referring to the same embodiment of the invention.

FIGS. 1A-1J show schematic cross-sectional views of formation of metal-containing cap layers in Cu metallization of a semiconductor device according to embodiments of the invention. FIG. 1A shows a patterned substrate 1 containing a plurality of recessed features 10 in a dielectric layer 100. The recessed features 10 may be formed using conventional lithography and plasma etching techniques. The recessed features 10 may be a part of high-aspect-ratio interconnect structures. The recessed features 10 can have an aspect ratio (depth/width) greater than or equal to about 2:1, for example 3:1, 4:1, 5:1, 6:1, 12:1, 15:1, or greater. The recessed features 10 have a width 11 that can be less than approximately 500 nm ($nm=10^{-9}$ m), for example 250 nm, 200 nm, 150 nm, 100 nm, 65 nm, 45 nm, 32 nm, 20 nm, or smaller. However, embodiments of the invention are not limited to these aspect ratios or feature widths, as other aspect ratios and feature widths may be utilized. It will be understood that embodiments of the invention may be applied to a variety of simple and complicated recessed features found in semiconductor manufacturing.

The dielectric layer 100 can, for example, contain $SiO_2$, a low-k dielectric material, or a high-k dielectric material. Low-k dielectric materials have a nominal dielectric constant less than the dielectric constant of $SiO_2$, which is approximately 4 (e.g., the dielectric constant for thermally grown silicon dioxide can range from 3.8 to 3.9). High-k materials have a nominal dielectric constant greater than the dielectric constant of $SiO_2$.

As is known to those in the semiconductor art, interconnect delay is a major limiting factor in the drive to improve the speed and performance of integrated circuits (ICs). One way to minimize interconnect delay is to reduce interconnect capacitance by using low-k materials during production of the ICs. Such low-k materials have also proven useful for low temperature processing. Thus, in recent years, low-k materials have been developed to replace relatively high dielectric constant insulating materials, such as silicon dioxide. In particular, low-k films are being utilized for inter-level and intra-level dielectric layers between metal layers of semiconductor devices. Additionally, in order to further reduce the dielectric constant of insulating materials, material films are formed with pores, i.e., porous low-k materials. Such low-k materials can be deposited by a spin-on dielectric (SOD) method similar to the application of photo-resist, or by chemical vapor deposition (CVD).

Low-k dielectric materials may have a dielectric constant of less than 3.7, or a dielectric constant ranging from 1.6 to 3.7. Low-k dielectric materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric material. The low-k dielectric material can include BLACK DIAMOND® (BD) or BLACK DIAMOND® II (BDII) SiCOH material, commercially available from Applied Materials, Inc., or Coral® CVD films commercially available from Novellus Systems, Inc. Other commercially available carbon-containing materials include SiLK® (e.g., SiLK-I, SiLK-J, SiLK-H, SiLK-D, and porous SiLK semiconductor dielectric resins) and CYCLOTENE® (benzocyclobutene) available from Dow Chemical, and GX-3™, and GX-3P™ semiconductor dielectric resins available from Honeywell.

Low-k dielectric materials include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

In addition, low-k materials include an silicate-based material, such as hydrogen silsesquioxane (HSQ) or methyl silsesquioxane (MSQ), deposited using SOD techniques. Examples of such films include FOx® HSQ commercially available from Dow Corning, XLK porous HSQ commercially available from Dow Corning, and JSR LKD-5109 commercially available from JSR Microelectronics.

Figure 1B:
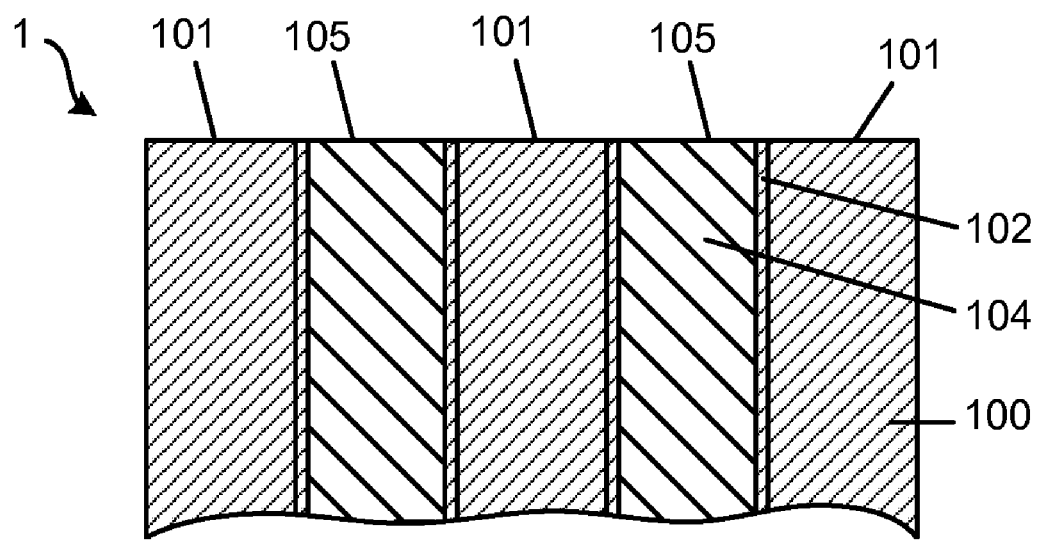

FIG. 1B shows the patterned substrate 1 following further processing that forms a diffusion barrier layer 102 in the recessed features 10 of FIG. 1A, and metal layers 104 (e.g., Cu or W) filling the recessed features 10. The diffusion barrier layer 102 can, for example, contain a tantalum (Ta)-containing layer (e.g., Ta, TaC, TaN, or TaCN, or a combination thereof), a titanium (Ti)-containing layer (e.g., Ti, TiN, or a combination thereof), or a tungsten (W)-containing layer (e.g., W, WN, or a combination thereof), or a combination of two or more thereof. According to one embodiment of the invention, the diffusion barrier layer 102 may further contain an adhesion layer, e.g., a Ru metal layer or a metal alloy containing Ru metal, that is in direct contact with the metal layers 104 in the recessed features 10. In some examples, the diffusion barrier layer 102 can have a thickness that is less than approximately 5 nm. In one example, a thickness of a Ru metal adhesion layer can be approximately 2 nm.

In FIG. 1B, the patterned substrate 1 has been planarized to form metal surfaces 105 and dielectric layer surfaces 101. Cu metal filling of the recessed features 10 may be performed by a Cu plating process, for example by an electrochemical plating process or by an electroless plating process, and the planarization may be performed by chemical mechanical polishing (CMP) following the Cu plating process. The CMP process may be optimized for Cu removal with high selectivity to the dielectric layer 100. The planarization removes excess Cu metal from the patterned substrate 1 following the Cu filling process and further removes the diffusion barrier layer 102 from the dielectric layer surfaces 101. CMP and Cu plating processes are well known to those skilled in the art.

Although not shown in FIG. 1B, residues or contaminants may be present on the dielectric layer surfaces 101 and on the metal surfaces 105 following a CMP process. The contaminants may include oxidized copper on the metal surfaces 105. The residues or contaminants may include benzotriazine (BTA) that is a chemical agent commonly used in a CMP process. The patterned substrate 1 may, for example, be cleaned of the residues or contaminants such as oxidized metal by exposure to thermally excited or plasma excited process gas containing $H_2$, $NH_3$, $N_2$, $NH(CH_3)_2$, $N_2H_4$, or $N_2H_3CH_3$, or a combination thereof.

Embodiments of the invention provide improved selectivity for forming metal-containing cap layers on metal surfaces such as metal surfaces 105 while preventing or minimizing formation of additional metal-containing material on the dielectric layer surfaces 101 between the metal surfaces 105. This improved selectivity provides an improved margin for line-to-line breakdown and electrical leakage performance in the semiconductor device containing the metal-containing cap layers.

While low-k materials are promising for fabrication of semiconductor circuits, integration of low-k materials (e.g., SiCOH materials) into semiconductor manufacturing presents several problems. Both non-porous and porous low-k materials tend to be brittle (i.e., have low cohesive strength, low elongation to break, and low fracture toughness), and less robust than more traditional dielectric materials and can be damaged during wafer processing, such as by etch and plasma ashing processes generally used in patterning the dielectric materials. Furthermore, liquid water and water vapor reduce the cohesive strength of the low-k material even further.

For example, removal of hydrophobic functional groups, e.g., —$CH_3$, from a surface of low-k materials containing Si—$CH_3$ groups during pattern etching or CMP are thought to provide unwanted adsorption sites for metal-containing precursors and reduce incubation time for metal-containing deposition onto the dielectric layer surfaces. Further, many low-k materials are porous and exposures of these materials to metal-containing precursor vapor may trap and react the metal-containing precursor molecules in the pores.

Figure 3A:
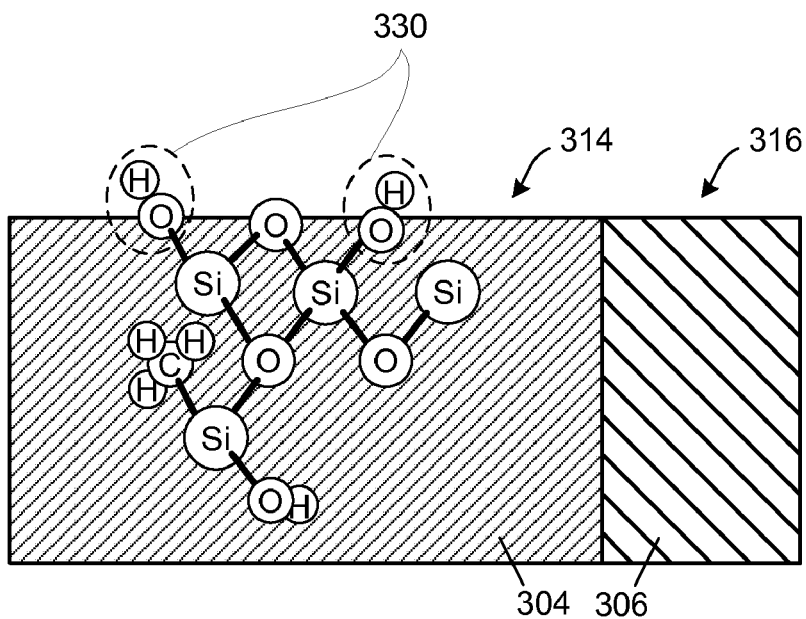
FIG. 3A shows a schematic cross-sectional view of a SiCOH low dielectric constant (low-k) layer containing a hydrophilic surface.

FIG. 3A shows a schematic cross-sectional view of a patterned substrate containing a metal surface and a low-k dielectric layer containing a hydrophilic surface. The exemplary SiCOH low-k dielectric layer 304 contains a hydrophilic surface 314 with hydrophilic functional groups 330. The exemplary hydrophilic functional groups 330 are hydroxyl groups (—OH groups) that may be formed by removal of —$CH_3$ groups from the SiCOH low-k dielectric layer 304 during pattern etching or CMP. The hydrophilic functional groups 330 are thought to provide unwanted adsorption sites for metal-containing precursors that significantly reduce the incubation time for metal-containing deposition on the hydrophilic surface 314. Thus, selective deposition of a metal-containing layer on the metal surface 316 relative to on the hydrophilic surface 314 is problematic.

Figure 2B:
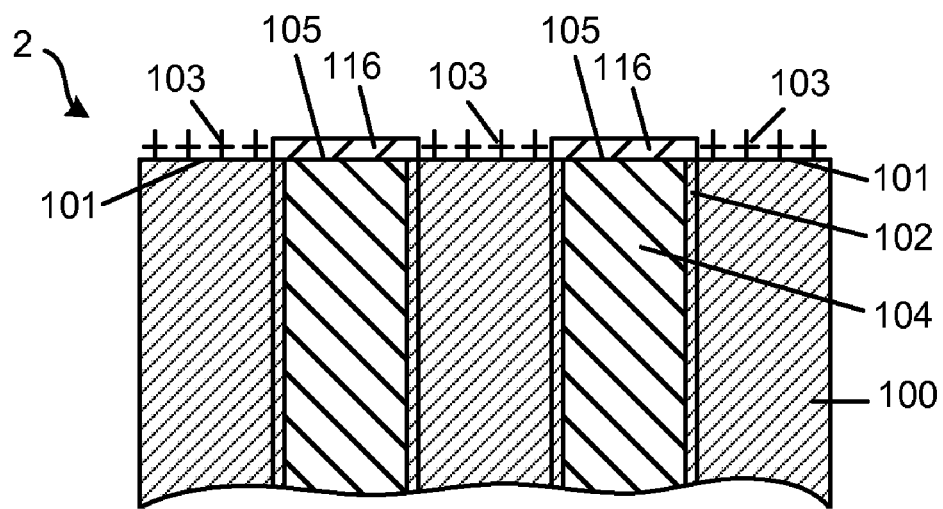
Figure 3B:
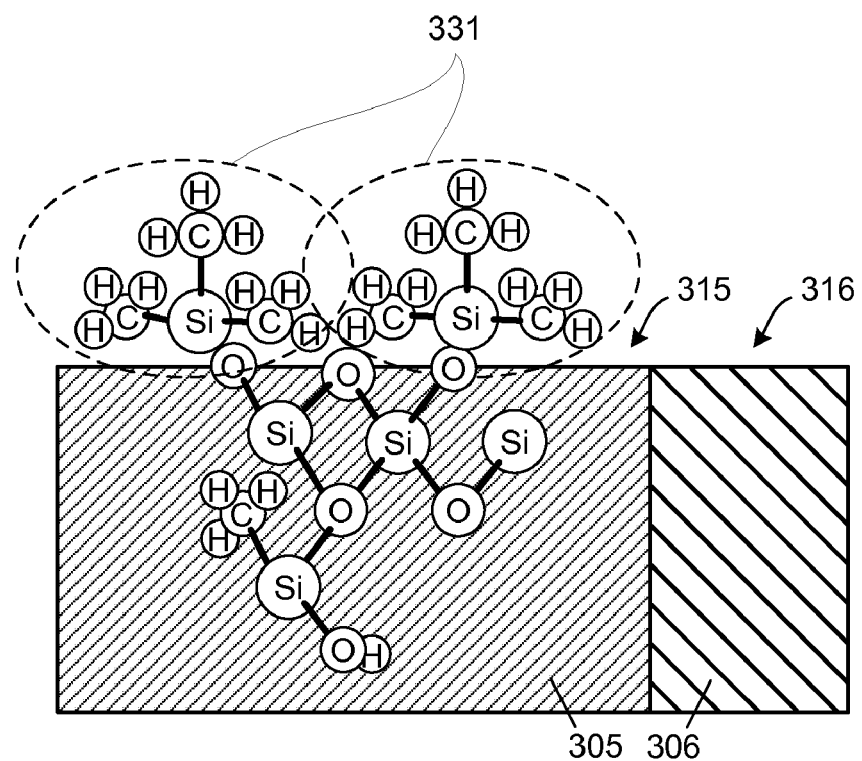
FIG. 3B shows a schematic cross-sectional view of a modified SiCOH low-k layer containing a hydrophobic surface according to an embodiment of the invention.

FIG. 3B shows a schematic cross-sectional view of a modified SiCOH low-k material containing a hydrophobic surface according to an embodiment of the invention. The modified SiCOH low-k layer 305 contains a hydrophobic surface 315 with hydrophobic functional groups 331. Exemplary —Si(CH$_3$)$_3$ hydrophobic functional groups 331 are depicted in FIG. 2B. According to embodiments of the invention, the hydrophobic surface 315 containing hydrophobic functional groups 331 may be prepared by exposing the hydrophilic surface 314 in FIG. 3A to a reactant gas containing a hydrophobic functional group, thereby substituting the hydrophilic functional groups 330 with the hydrophobic functional group from the reactant gas. This substitution improves selective metal-containing deposition on the metal surface 316 and/or other metal-containing surfaces that have a short incubation time for metal-containing deposition, relative to on the hydrophobic surface 315 that has a long incubation time. The hydrophobic surface 315 contains few or no adsorption sites for metal-containing precursors and, therefore, an exposure of the hydrophobic surface 315 to a metal-containing precursor results in a long incubation time and delayed metal-containing deposition on the hydrophobic surface 315 relative to on the metal surface 316. This enables selective formation of a metal-containing layer on the metal surface 316 with little or no deposition on the hydrophobic surface 315. Furthermore, in the case of a porous SiCOH low-k dielectric layer 304 and a modified porous SiCOH low-k dielectric layer 305, the hydrophobic functional group may at least partially fill pores in porous SiCOH low-k dielectric layer 304, thereby preventing or reducing transport and subsequent reaction of metal-containing precursor molecules in the pores.

Figure 1C:
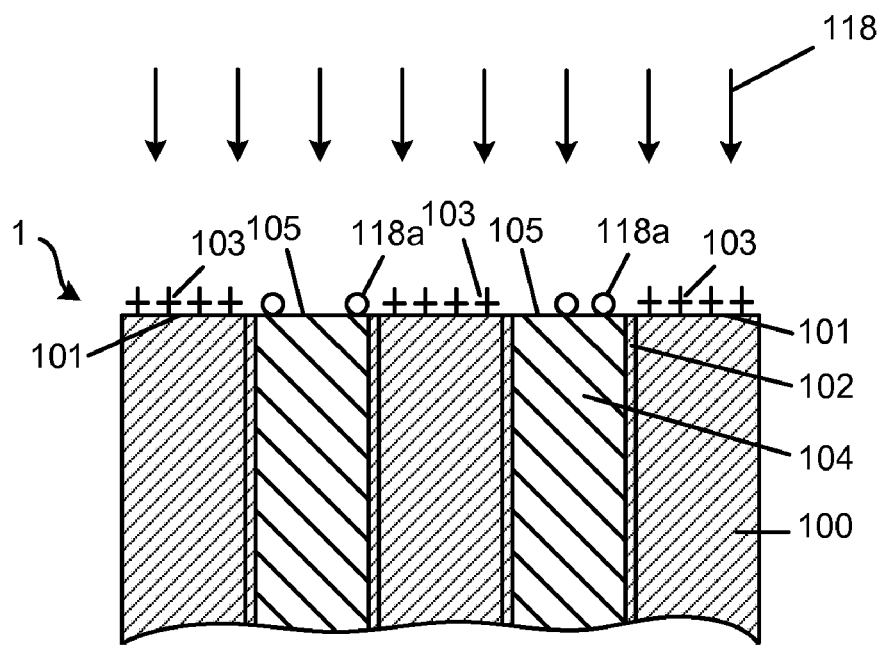

FIG. 1C schematically shows exposure of the patterned substrate 1 to a reactant gas 118 containing a hydrophilic functional group. According to some embodiments of the invention, the reactant gas can contain a silicon-containing gas, including an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof. The exposure to the reactant gas 118 may be performed for a time period between about 10 seconds and about 120 minutes, or between about 30 seconds and about 60 seconds, at a gas pressure between about 0.1 Torr and about 10 Torr, or between about 1 Torr and about 5 Torr, at a substrate temperature between about 20° C. and about 400° C., or between about 50° C. and about 250° C., for example. The reactant gas 118 may be plasma-excited (by a remote plasma or a direct plasma above the patterned substrate 1) or the reactant gas may be exposed to the patterned substrate 1 in the absence of plasma excitation.

According to some embodiments of the invention, the reactant gas may be selected from dimethylsilane dimethylamine (DMSDMA), trimethylsilane dimethylamine (TMSDMA), bis(dimethylamino) dimethylsilane (BDMADMS), and other alkyl amine silanes. According to other embodiments, the reactant gas may be selected from N,O-bistrimethylsilyltrifluoroacetamide (BSTFA) and trimethylsilyl-pyrrole (TMS-pyrrole).

According to some embodiments of the invention, the reactant gas may be selected from silazane compounds. Silazanes are saturated silicon-nitrogen hydrides. They are analogous in structure to siloxanes with —NH-replacing —O—. An organic silazane precursor can further contain at least one alkyl group bonded to the Si atom(s). The alkyl group can, for example, be a methyl group, an ethyl group, a propyl group, or a butyl group, or combinations thereof. Furthermore, the alkyl group can be a cyclic hydrocarbon group such as a phenyl group. In addition, the alkyl group can be a vinyl group. Disilazanes are compounds having from 1 to 6 methyl groups attached to the silicon atoms or having 1 to 6 ethyl groups attached the silicon atoms, or a disilazane molecule having a combination of methyl and ethyl groups attached to the silicon atoms.

The structure of hexamethyldisilazane (HMDS) is shown below.

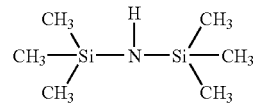

HMDS contains a Si—N—Si structural unit and three methyl groups bonded to each Si atom. HMDS is a commercially available silicon compound with a vapor pressure of about 20 Torr at 20° C.

Examples of organic silazane compounds are shown in TABLE 1.

TABLE 1

| | |
|---|---|
| Triethylsilazane | SiC$_6$H$_{17}$N |
| Tripropylsilazane | SiC$_9$H$_{23}$N |
| Triphenylsilazane | SiC$_{18}$H$_{17}$N |
| Tetramethyldisilazane | Si$_2$C$_4$H$_{15}$N |
| Hexamethyldisilazane | Si$_2$C$_6$H$_{19}$N |
| Hexaethyldisilazane | Si$_2$C$_{12}$H$_{31}$N |
| Hexaphenyldisilazane | Si$_2$C$_{36}$H$_{31}$N |
| Heptamethyldisilazane | Si$_2$C$_7$H$_{21}$N |
| Dipropyl-tetramethyldisilazane | Si$_2$C$_{10}$H$_{27}$N |
| Di-n-Butyl-tetramethyldisilazane | Si$_2$C$_{12}$H$_{31}$N |
| Di-n-Octyl-tetramethyldisilazane | Si$_2$C$_{20}$H$_{47}$N |
| Triethyl-trimethylcyclotrisilazane | Si$_2$C$_9$H$_{27}$N$_3$ |
| Hexamethylcyclotrisilazane | Si$_3$C$_6$H$_{21}$N$_3$ |
| Hexaethylcyclotrisilazane | Si$_3$C$_{12}$H$_{33}$N$_3$ |
| Hexaphenylcyclotrisilazane | Si$_3$C$_{36}$H$_{33}$N$_3$ |
| Octamethylcyclotetrasilazane | Si$_4$C$_8$H$_{28}$N$_4$ |
| Octaethylcyclotetrasilazane | Si$_4$C$_{16}$H$_{44}$N$_4$ |
| Tetraethyl-tetramethylcyclotetrasilazane | Si$_4$C$_{12}$H$_{36}$N$_4$ |
| Cyanopropylmethylsilazane | SiC$_5$H$_{10}$N$_2$ |
| Tetraphenyldimethyldisilazane | Si$_2$C$_{26}$H$_{27}$N |
| Diphenyl-tetramethyldisilazane | Si$_2$C$_{16}$H$_{23}$N |
| Trivinyl-trimethylcyclotrisilazane | Si$_3$C$_9$H$_{21}$N$_3$ |
| Tetravinyl-tetramethylcyclotetrasilazane | Si$_4$C$_{12}$H$_{28}$N$_4$ |
| Divinyl-tetramethyldisilazane | Si$_2$C$_8$H$_{19}$N |

Still referring to FIG. 1C, exposure of the patterned substrate 1 to the reactant gas 118 forms modified dielectric layer surfaces 103 by substituting a hydrophilic functional group (e.g., —OH group) in the dielectric layer surfaces 101 with a hydrophobic functional group (e.g., —Si(CH$_3$)$_3$ group) from the reactant gas 118. The hydrophobic functional group is depicted by a "+" symbol on the modified dielectric layer surfaces 103.

Figure 1D:
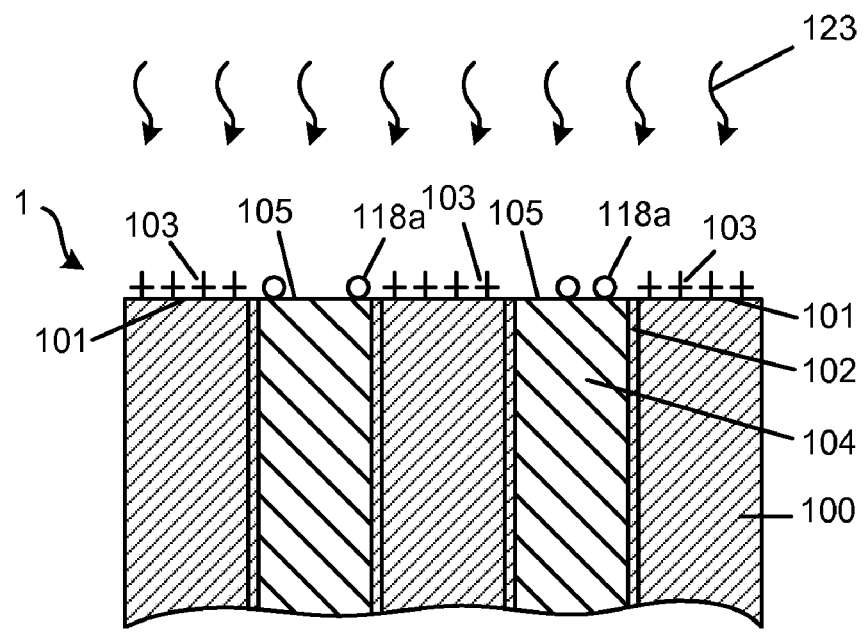
Figure 1E:
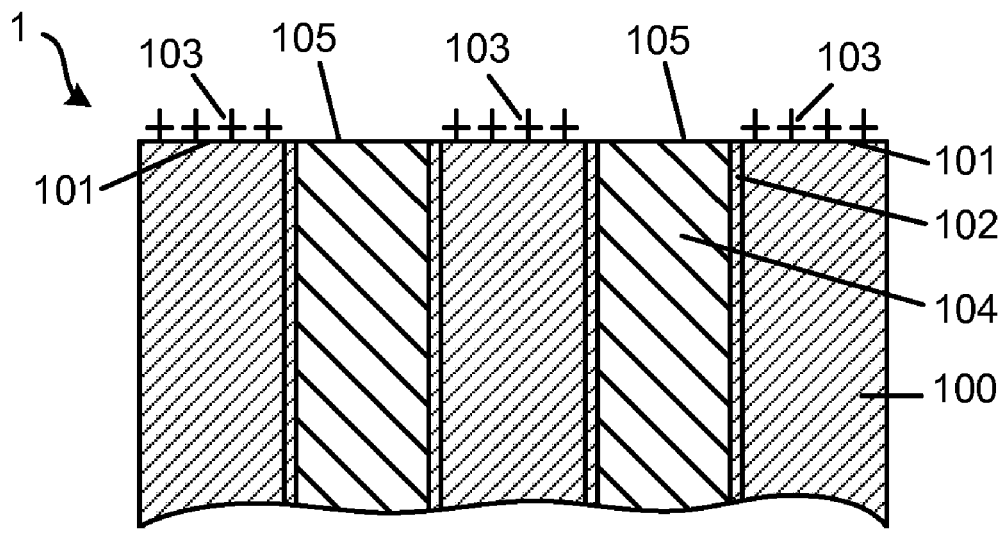

As shown in FIG. 1C, exposure of the patterned substrate 1 to the reactant gas 118 may further result in small amounts of adsorbed reactant gas 118a on the metal surfaces 105. According to one embodiment of the invention, following the exposure of the reactant gas 118, the patterned substrate 1 may be heat-treated to a temperature that removes adsorbed reactant gas 118a from the metal surfaces 105 without removing the hydrophobic functional group from the modified dielectric layer surfaces 103. In FIG. 1D, arrows 123 represent heat-treating of the patterned substrate 1 to remove the adsorbed reactant gas 118a. The resulting patterned substrate 1 is depicted in FIG. 1E. In one example, Cu metal surfaces 105 may be heat-treated at a temperature of about 350° C. to selectively remove adsorbed TMSDMA reactant gas from the Cu metal surfaces 105. According to other embodiments, the heat-treating depicted in FIG. 1D may be omitted.

According to one embodiment of the invention, the metal surfaces 105 on the patterned substrate 1 depicted in FIG. 1E may be exposed to a reducing gas to reduce oxidized metal on the metal surfaces 105 and thereby provide clean metal surfaces 105 for further processing. For example, the metal surfaces 105 may be exposed to thermally excited or plasma excited reducing gas containing $H_2$, $NH_3$, $N_2$, $NH(CH_3)_2$, $N_2H_4$, or $N_2H_3CH_3$, or a combination thereof.

Figure 1F:
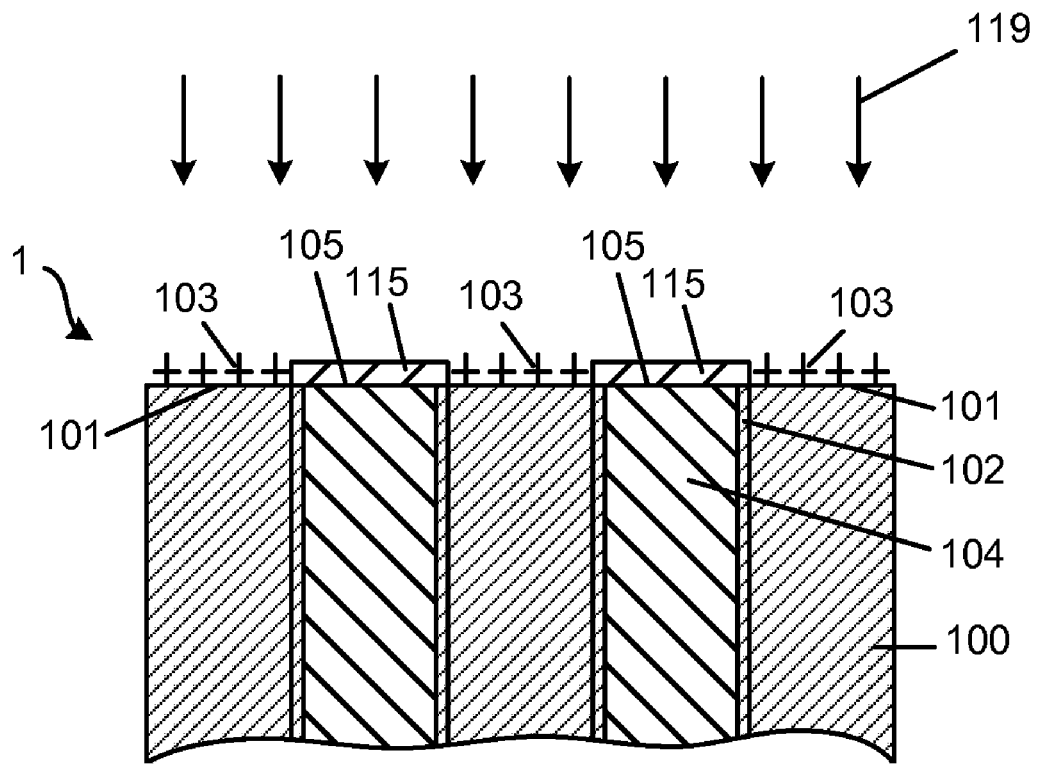

FIG. 1F schematically shows exposure of the patterned substrate 1 to a deposition gas 119 containing metal-containing precursor vapor according to one embodiment of the invention. The deposition gas 119 can further contain a carrier gas (e.g., an inert gas), a reducing gas, or both a carrier gas and a reducing gas. The metal-containing precursor vapor can contain a metal-containing precursor that may be selected from ruthenium (Ru)-containing precursors, cobalt (Co)-containing precursors, molybdenum (Mo)-containing precursors, tungsten (W)-containing precursors, platinum (Pt)-containing precursors, iridium (Ir)-containing precursors, rhodium (Rh)-containing precursors, and rhenium (Re)-containing precursors. Exemplary Ru-containing precursors include $Ru_3(CO)_{12}$, (2,4-dimethylpentadienyl)(ethylcyclopentadienyl)ruthenium(Ru(DMPD)(EtCp)), bis(2,4-dimethylpentadienyl)ruthenium($Ru(DMPD)_2$), 4-dimethylpentadienyl)(methylcyclopentadienyl)ruthenium(Ru(DMPD)(MeCp)), or bis(ethylcyclopentadienyl)ruthenium($Ru(EtCp)_2$). Exemplary Co precursors include $Co_2(CO)_8$, $Co_4(CO)_{12}$, $CoCp(CO)_2$, $Co(CO)_3(NO)$, $Co_2(CO)_6(HCC^tBu)$, $Co(acac)_2$, $Co(Cp)_2$, $Co(Me_5Cp)_2$, $Co(EtCp)_2$, cobalt(II) hexafluoroacetylacetonate hydrate, cobalt tris(2,2,6,6-tetramethyl-3,5-heptanedionate), cobalt(III) acetylacetonate, bis(N,N'-diisopropylacetamidinato)cobalt, and tricarbonyl allyl cobalt. One exemplary Mo precursor is $Mo(CO)_6$. Exemplary W precursors include $W(CO)_6$ and tungsten halides ($WX_6$, where X is a halogen). Exemplary Pt precursors include $Pt(CO)_2Cl_2$, $Pt(acac)_2$, $Me_2PtC_5H_5$, $Pt(PF_3)_4$, and $MeCpPtMe_3$. Exemplary Ir precursors include $Ir_4(CO)_{12}$, $Ir(allyl)_3$, (methylcyclopentadienyl)(1,5-cyclooctadiene)iridium(I), $(C_6H_7)(C_8H_{12})Ir$, and $IrCl_3$. Exemplary Rh precursors include $Rh(acac)(CO)_2$, $(\eta^5-C_5H_5)Rh(H_2C=CH_2)_2$, $(\eta^5-C_5H_5)Rh(CO)_2$, and $RhCl_3$. One exemplary Re precursor is $Re_2(CO)_{10}$. It will be appreciated by those skilled in the art that a number of other metal-containing precursors may be used in embodiments of the present invention.

In FIG. 1F, the exposure to the deposition gas 119 selectively deposits metal-containing cap layers 115 onto the metal surfaces 105, and as depicted in FIG. 1F, little or no metal-containing deposition occurs on the modified dielectric layer surfaces 103 due to lack of adsorption sites for the metal-containing precursors and blocking effects of the hydrophobic functional groups on the modified dielectric layer surfaces 103. The metal-containing cap layers 115 may contain metal layers, metal compound layers, or alternating layers of metal layers and metal compound layers. In one example, an average thickness of the metal-containing cap layers 115 can be between 2 angstrom (angstrom=$10^{-10}$ m) and 200 angstrom, for example about 2, 5, 10, 15, 20, 30, 40, 50, 100, or 200 angstrom. In some examples, the metal-containing cap layers 115 may have an average thickness between 2 and 5 angstrom. However, embodiments of the invention are not limited to those thicknesses and the metal-containing cap layers 115 may be thicker than 200 angstrom. According to one embodiment, a surface coverage of the metal-containing cap layers 115 on the metal surfaces 105 may be incomplete with gaps that expose the metal surfaces 105.

According to some embodiments of the invention, the metal-containing cap layers 115 may contain or consist of one or more metal layers. The metal layers may contain a metal element selected from Ru, Co, Mo, W, Pt, Ir, Rh, or Re, or a combination thereof. In some examples, the metal-containing cap layers 115 may be deposited on the patterned substrate 1 by exposing the patterned substrate 1 to the deposition gas 119 using chemical vapor deposition (CVD), plasma enhanced CVD (PECVD), atomic layer deposition (ALD), or plasma-enhanced ALD (PEALD) techniques. In one example, the metal-containing cap layers 115 may contain or consist of Ru metal and the diffusion barrier layer 102 may contain a Ru metal adhesion layer in direct contact with the metal layers 104. Thus, the portion of the metal layers 104 shown in FIG. 1F may be encapsulated with Ru metal.

According to other embodiments of the invention, the metal-containing cap layers 115 may contain or consist of metal compound layers. The metal compound layers may contain a metal element, for example one or more of the abovementioned metal elements, and a dopant. For example, the dopant may be a non-metal dopant element selected from phosphorus (P), boron (B), nitrogen (N), fluorine (F), chlorine (Cl), bromine (Br), silicon (Si), or germanium (Ge), or a combination thereof. In some embodiments, the metal compound layers may be deposited on the metal surfaces 105 by exposing the patterned substrate 1 to a deposition gas 119 containing metal-containing precursor vapor and a dopant gas. For example, the dopant gas may contain or consist of a non-metal dopant gas selected from $PH_3$, $BH_3$, $B_2H_6$, $BF_3$, $NF_3$, $NH_3$, $N_2$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$ or $GeCl_4$, or a combination of two or more thereof. In other embodiments, other Si-containing or Ge-containing non-metal dopant gases may be utilized.

Figure 1G:
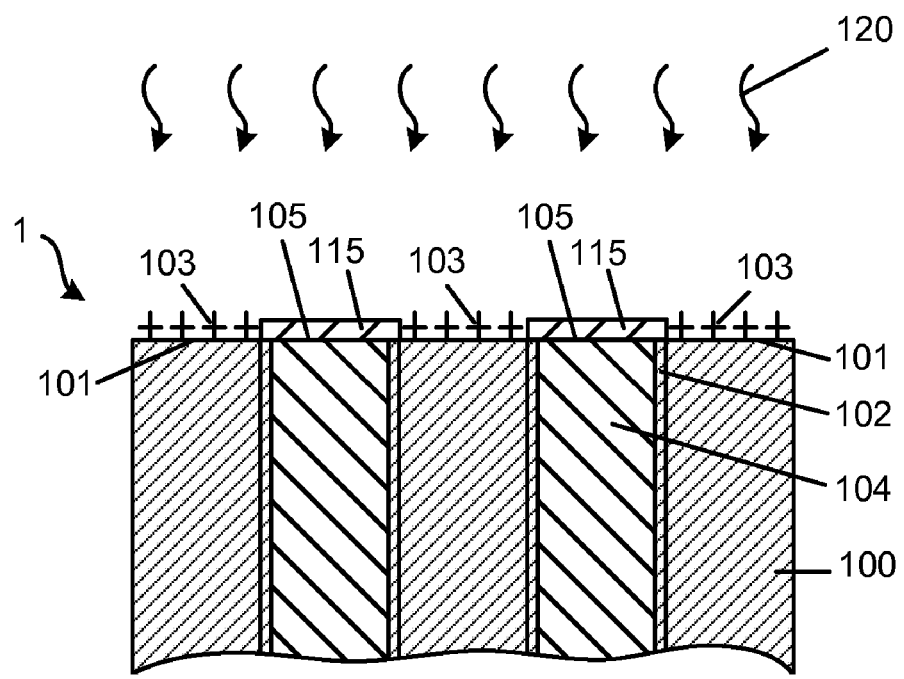

According to one embodiment of the invention, following the formation of the metal-containing cap layers 115 depicted in FIG. 1F, the hydrophobic functional group may be removed from the modified dielectric layer surfaces 103. In one example, the hydrophobic functional group may be removed by a heat-treating process that is performed under vacuum conditions and optionally in the presence of an inert gas. In FIG. 1G, arrows 120 represent heat-treating of the patterned substrate 1 to remove the hydrophobic functional group. The inert gas may be selected from nitrogen ($N_2$) gas and the noble gases (i.e., He, Ne, Ar, Kr, and Xe). Exemplary heat-treating conditions may further include an inert gas pressure in a range from about 1 mTorr to about 100 Torr, or in a range from about 100 m Torr to about 10 Torr, substrate temperature in a range from about 100° C. to about 500° C., or in a range from about 200° C. to about 400° C., and heat-treating times in a range from about 1 min to about 30 minutes, but embodiments of the invention are not limited by these conditions as other heat-treating conditions may be utilized. According to some embodiments of the invention, the substrate temperature during the heat-treating is higher that the substrate temperature during the exposure of the patterned substrate 1 to the reactant gas 118 depicted in FIG. 1C and higher than the substrate temperature during the optional heat-treating for removing the adsorbed reactant gas 118a from the metal surfaces 105 in FIG. 1D.

Figure 1H:
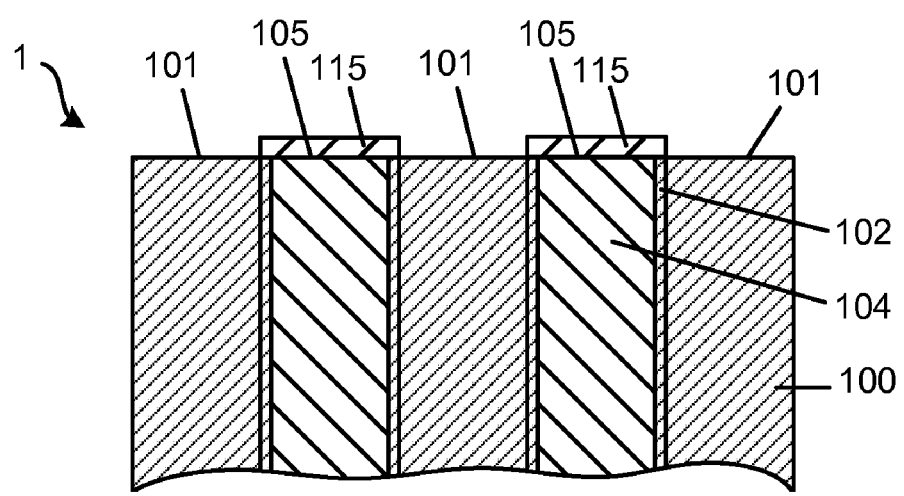
Figure 1I:
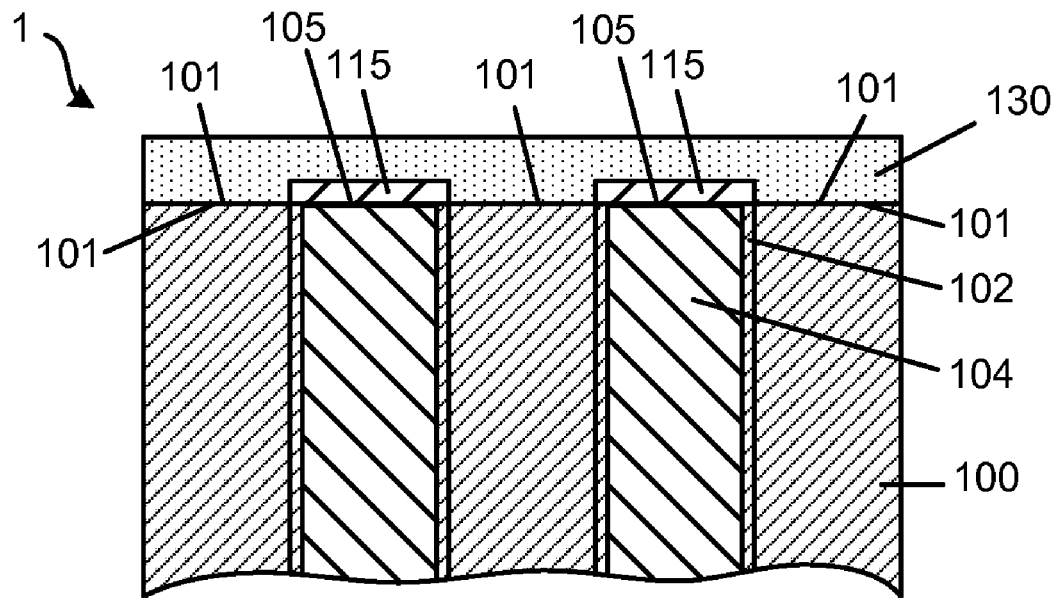

FIG. 1H shows the patterned substrate 1 following the heat-treating process where the hydrophobic functional group has been removed from the modified dielectric layer surfaces 103.

FIG. 11 shows a dielectric diffusion barrier layer 130 formed on the metal-containing cap layers 115 and on the dielectric layer surfaces 101 after further processing of the patterned substrate 1 in FIG. 1H. The dielectric diffusion barrier layer 130 can, for example, contain silicon nitride (SiN), silicon carbide (SiC), or silicon carbonitride (SiCN).

Figure 1J:
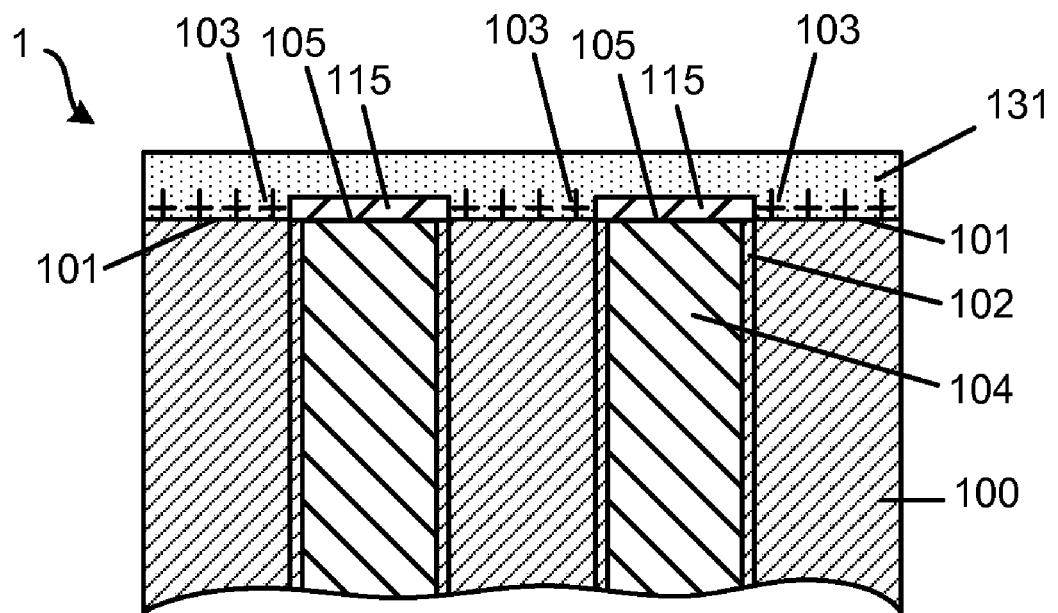

According to another embodiment of the invention, the heat-treating step depicted in FIG. 1G may be omitted and the patterned substrate shown in FIG. 1F further processed. FIG. 1J shows a second dielectric diffusion barrier layer 131 formed on the metal-containing cap layers 115 and on the modified dielectric layer surfaces 103. The second dielectric diffusion barrier layer 131 can, for example, contain SiN, SiC, or SiCN.

Figure 2A:
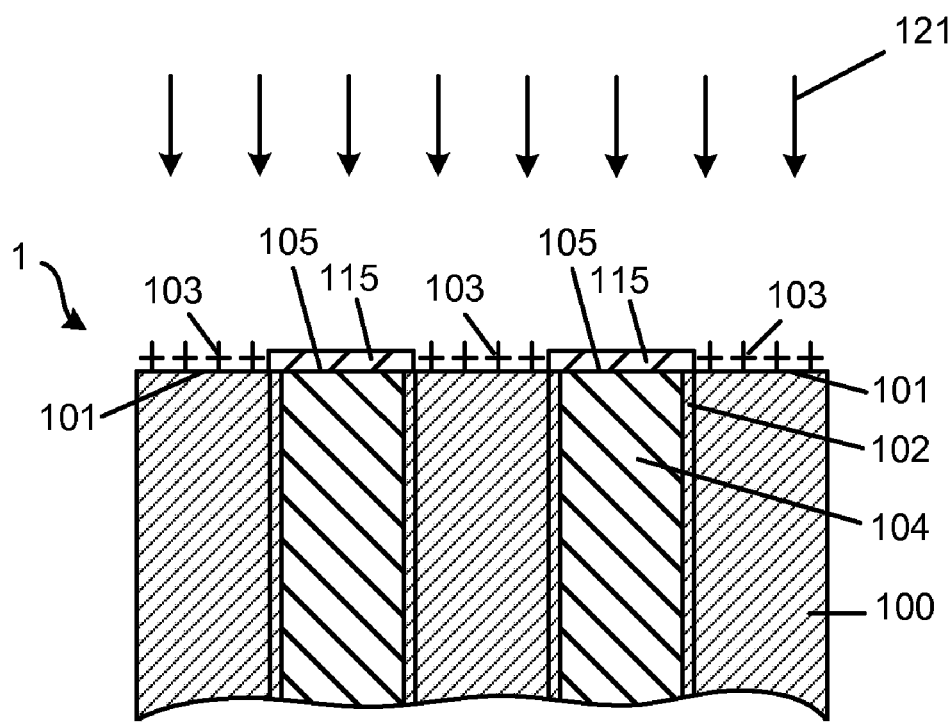
FIGS. 2A-2F show schematic cross-sectional views of formation of metal-containing cap layers in Cu metallization of a semiconductor device according to embodiments of the invention.

FIGS. 2A-2F show schematic cross-sectional views of formation of metal-containing cap layers in Cu metallization of a semiconductor device according to embodiments of the invention. FIG. 2A shows exposure of the patterned substrate 1 depicted in FIG. 1F to a dopant gas 121. The metal-containing cap layers 115 may contain or consist of metal layers containing a metal element selected from Ru, Co, Mo, W, Pt, Ir, Rh, or Re, or a combination thereof. In one example, the exposure incorporates a dopant from the dopant gas 121 into a least a portion of the thickness of metal-containing cap layers 115 to form metal compound layers. Exemplary non-metal dopants and non-metal dopant gases were described above. In one example, a dopant may be incorporated into at least a portion of the thickness of the metal-containing cap layers 115 by exposure to a dopant gas 121 in a thermally excited or plasma-excited process. In another example, a dopant may be incorporated into at least a portion of the thickness of the metal-containing layers by exposure to a gas cluster ion beam (GCIB) comprising dopant gas 121 and optionally an inert gas such as argon (Ar) or helium (He). An exemplary GCIB processing system is described U.S. patent application Ser. No. 12/182,363, entitled "Method of Forming Semiconductor Devices containing Metal Cap Layers", the entire contents of which is herein incorporated by reference. In yet another example, a dopant may be incorporated into at least a thickness of the metal-containing cap layers 115 by exposure to a conventional ion implant beam comprising dopant gas 121 and optionally an inert gas such as Ar or He. Although not shown in FIG. 2B, incorporation of a dopant into the metal-containing cap layers 115 may also result in incorporation of the dopant into the modified dielectric layer surfaces 103, into the metal layers 104, and into the dielectric layer 100.

FIG. 2B shows patterned substrate 2 following formation of a modified metal-containing cap layers 116 by incorporation of a dopant into the metal-containing cap layers 115 by exposure to the dopant gas 121.

Figure 2C:
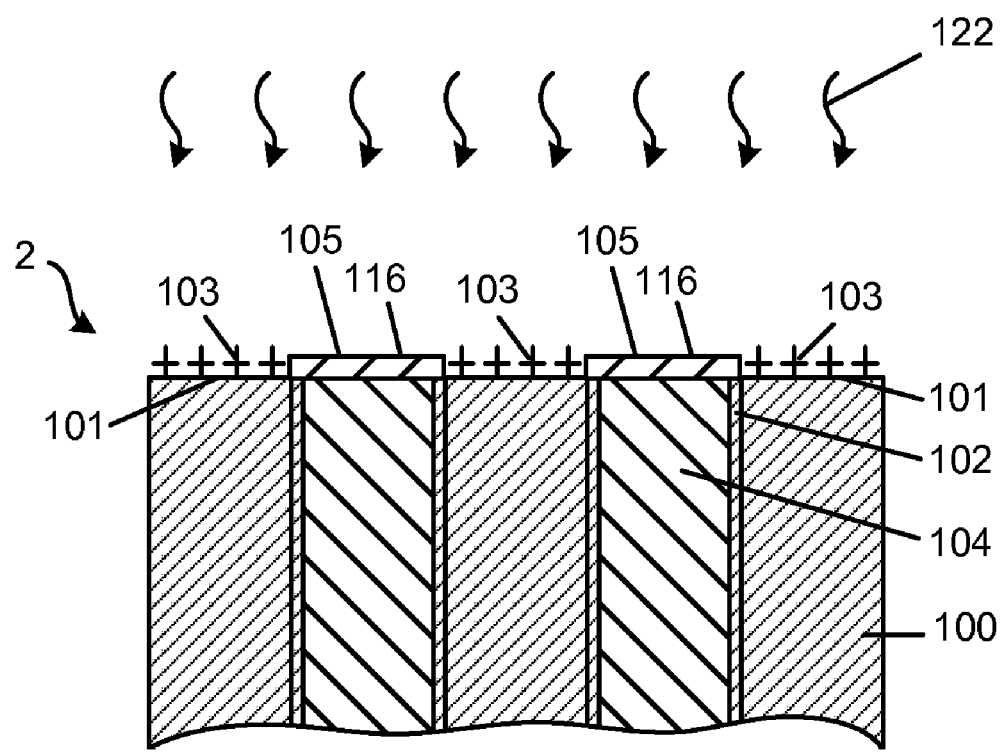

According to one embodiment of the invention, following the formation of the modified metal-containing cap layers 116 depicted in FIG. 2B, the hydrophobic functional group may be removed from the modified dielectric layer surfaces 103. In one example, the hydrophobic functional group may be removed by a heat-treating process under vacuum conditions and optionally in the presence of an inert gas. In FIG. 2C, arrows 122 represent heat-treating of the patterned substrate 2. The inert gas may be selected from $N_2$ gas and the noble gases. Exemplary heat-treating conditions may further include an inert gas pressure in a range from about 1 mTorr to about 100 Torr, or in a range from about 100 mTorr to about 10 Torr, substrate temperature in a range from about 100° C. to about 500° C., or in a range from about 200° C. to about 400° C., and heat-treating times in a range from about 1 min to about 30 minutes, but embodiments of the invention are not limited by these conditions as other heat-treating conditions may be utilized. According to some embodiments of the invention, the substrate temperature during the heat-treating is higher that the substrate temperature during the exposure of the patterned substrate 1 to the reactant gas 118 depicted in FIG. 1C.

Figure 2D:
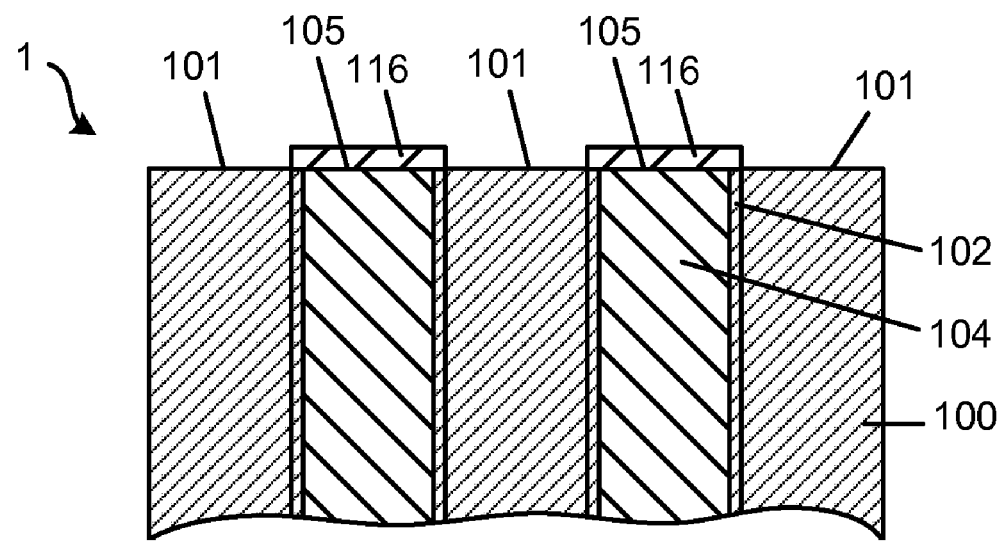

FIG. 2D shows the patterned substrate 2 following the heat-treating process where the hydrophobic functional group has been removed from the modified dielectric layer surfaces 103.

Figure 2E:
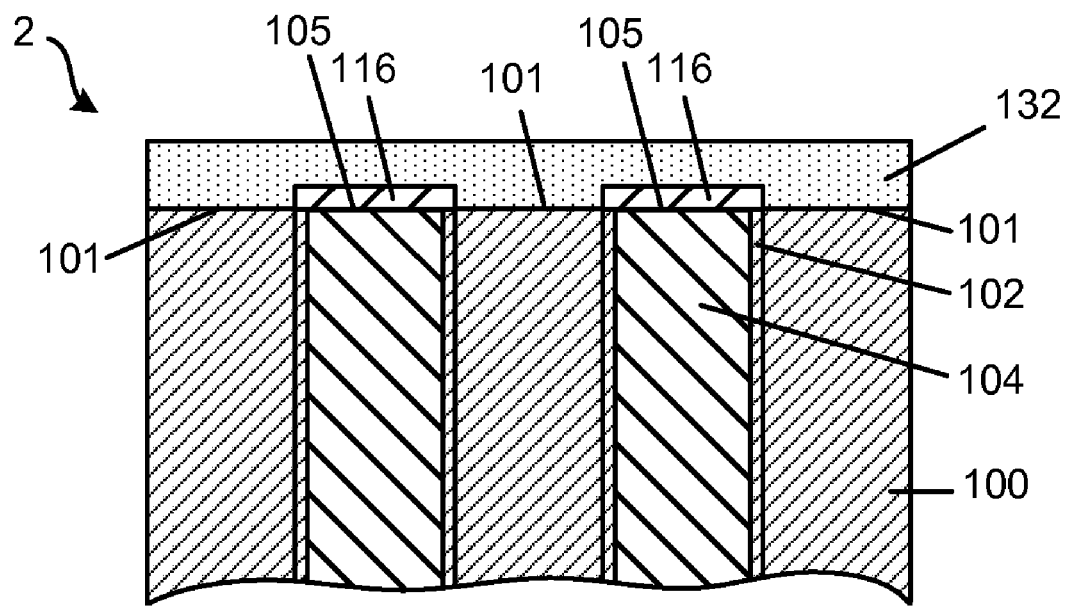

FIG. 2E shows a third dielectric diffusion barrier layer 132 formed on the modified metal-containing cap layers 116 and on the dielectric layer surfaces 101. The third dielectric diffusion barrier layer 132 can, for example, contain SiN, SiC, or SiCN.

Figure 2F:
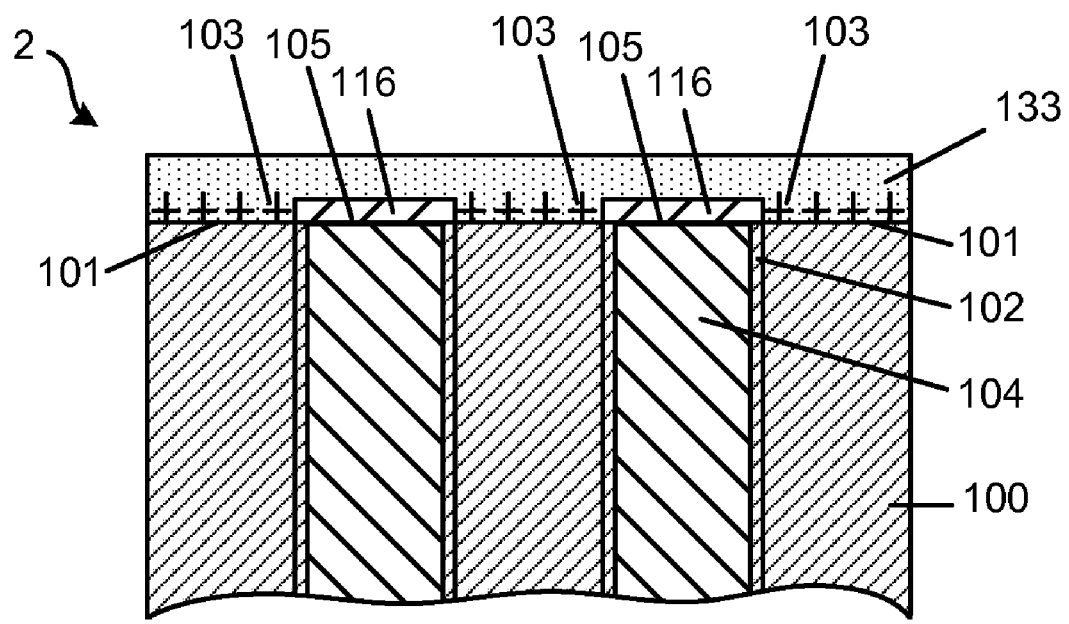

According to another embodiment of the invention, the heat-treating step depicted in FIG. 2C may be omitted and a fourth dielectric diffusion barrier layer 133 can be formed on the modified metal-containing cap layers 116 and on the modified dielectric layer surfaces 103. This is depicted in FIG. 2F.

According to yet other embodiment of the invention, the hydrophobic functional group may be removed from the modified dielectric layer surfaces 103 in FIG. 2A, prior to exposing the patterned substrate 1 to the dopant gas 121.

According to still other embodiments of the invention, the metal-containing cap layers 115 depicted in FIG. 1F and modified metal-containing cap layers 116 in FIG. 2B may contain alternating metal layers and metal compound layers. In one example, metal layers may be deposited onto the metal surfaces 105 and metal compound layers may deposited onto the metal layers. In another example, metal compound layers may be deposited onto the metal surfaces 105 and metal layers deposited onto the metal compound cap layers. The alternating depositions of metal layers and metal compound layers may be repeated a plurality of times.

FIGS. 4A-4I show schematic cross-sectional views of formation of metal-containing cap layers in Cu metallization of a dual damascene interconnect structure according to embodiments of the invention. Several of the processing steps in FIGS. 4A-4I have been described in detail in reference to FIGS. 1 and 2 and are therefore not described in detail here.

Figure 4A:
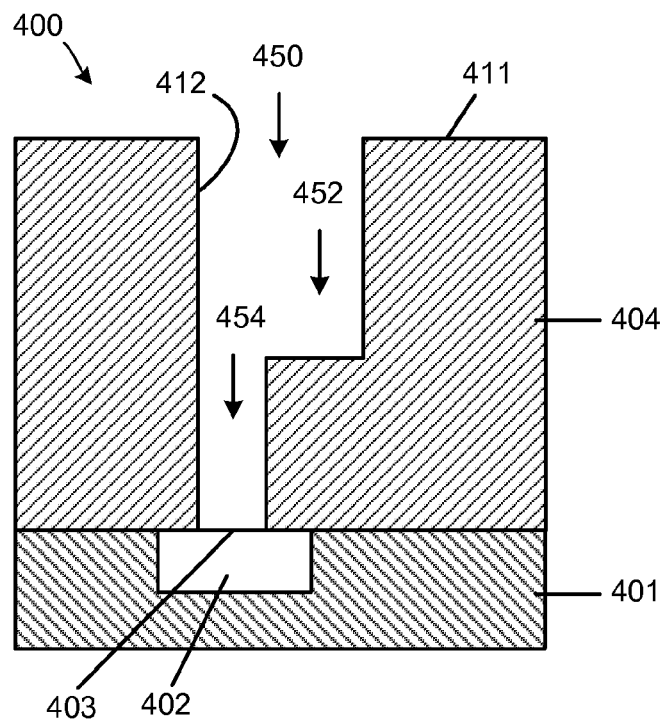
FIGS. 4A-4I show schematic cross-sectional views of formation of metal-containing cap layers in dual damascene Cu metallization according to embodiments of the invention.

FIG. 4A shows a schematic cross-sectional view of a partially manufactured dual damascene interconnect structure 400 according to an embodiment of the invention. The dual damascene interconnect structure 400 can be formed using standard lithography and etching methods known to those skilled in the art. It will be understood that embodiments of the invention may also be applied to simpler or more complicated dual damascene interconnect structures and formed in low-k materials. Although only a single dual damascene interconnect structure 400 is depicted in FIGS. 4A-4F, those skilled in the art will readily recognize that semiconductor devices conventionally contain a plurality of dual damascene interconnect structures 400.

In FIG. 4A, the dual damascene interconnect structure 400 contains a recessed feature 450 containing a trench 452 and a via 454 etched in a dielectric layer 404. The dielectric layer 404 contains dielectric layers surfaces 412 in the recessed feature 450 and dielectric layer surfaces 411 outside of the recessed feature 450. Several low-k materials that may be used as dielectric layer 404 were described above in reference to FIG. 1. Furthermore, the dual damascene interconnect structure 400 contains a metallization layer 402 (e.g., Cu metal or tungsten (W) metal) having a metal surface 403 inside the recessed feature 450 at the bottom of the via 454. Although not shown in FIG. 4A, the dual damascene interconnect structure 400 may contain additional layers, for example a trench etch stop layer, a via etch stop layer between dielectric layers 401 and 404, and a barrier layer separating the metallization layer 402 from the dielectric layer 401.

Figure 4B:
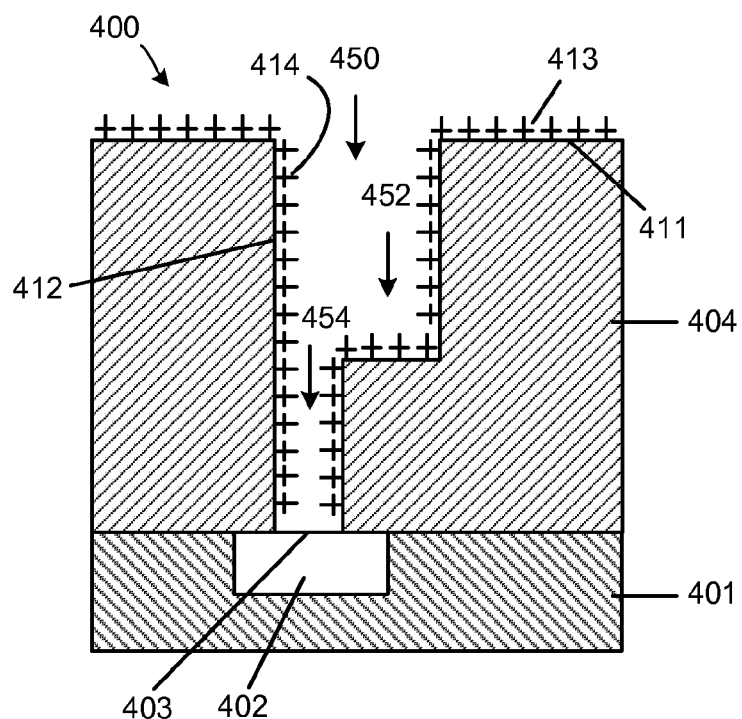

FIG. 4B shows the dual damascene interconnect structure 400 following exposure to a reactant gas that forms modified dielectric layer surfaces 413 and 414. The exposure to the reactant gas substitutes a hydrophilic functional group in the dielectric layer surfaces 411 and 412 with a hydrophobic functional group from the reactant gas. According to some embodiments of the invention, the reactant gas can contain a silicon-containing gas, including an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof.

Although not shown in FIG. 4B, exposure of the dual damascene interconnect structure 400 to the reactant gas may further result in a small amount of adsorbed reactant gas on the metal surface 403. According to one embodiment of the invention, the dual damascene interconnect structure 400 depicted in FIG. 4B may be heat-treated to remove adsorbed reactant gas from the metal surface 403 but not from the modified dielectric layer surfaces 413 and 414.

According to one embodiment of the invention, the metal surface 403 on the dual damascene interconnect structure 400 depicted in FIG. 4A or FIG. 4B may be exposed to a reducing gas to reduce oxidized metal on the metal surface 403 and thereby provide clean metal surface 403 for further processing. For example, the metal surface 403 may be exposed to thermally excited or plasma excited reducing gas containing $H_2$, $NH_3$, $N_2$, $NH(CH_3)_2$, $N_2H_4$, or $N_2H_3CH_3$, or a combination thereof.

Figure 4C:
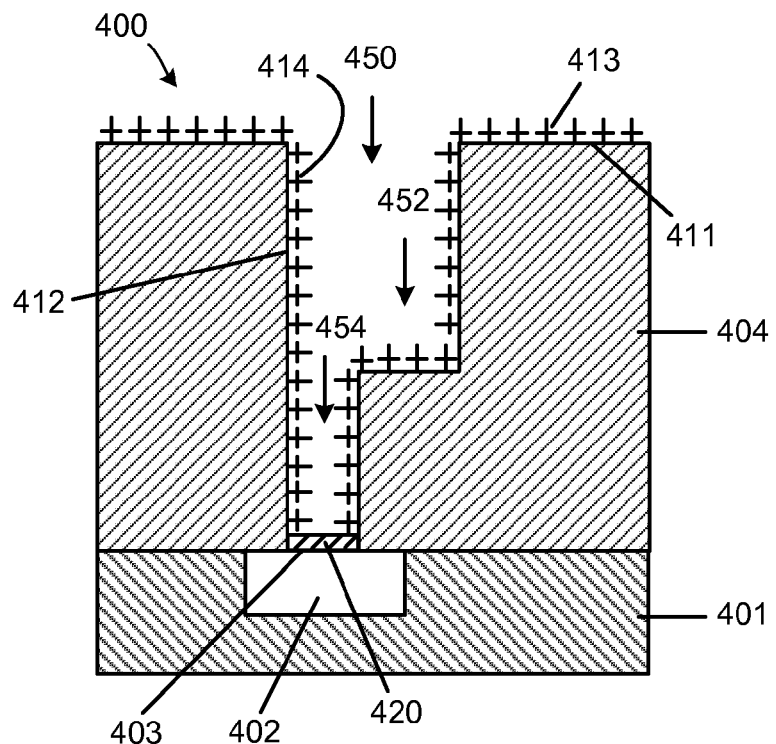

FIG. 4C shows the dual damascene interconnect structure 400 following an exposure to a deposition gas containing metal-containing precursor vapor. The exposure selectively deposits a first metal-containing cap layer 420 on the metal surface 403, with little or no metal-containing deposition on the modified dielectric layer surfaces 413,414 due to lack of adsorption sites for the metal-containing precursor and blocking effects of the hydrophobic functional groups on the modified dielectric layer surfaces 413,414. In one example, an average thickness of the first metal-containing cap layer 420 can be between 2 angstrom and 200 angstrom, for example about 2, 5, 10, 15, 20, 30, 40, 50, 100, or 200 angstrom. In some examples, the first metal-containing cap layer 420 may have an average thickness between 2 and 5 angstrom. However, embodiments of the invention are not limited to those thicknesses and a first metal-containing cap layer 420 that is thicker than 200 angstrom may be formed. According to one embodiment, a surface coverage of the first metal-containing cap layer 420 on the metal surface 403 may be incomplete with gaps that expose the metal surface 403.

According to some embodiment of the invention, the first metal-containing cap layer 420 may contain or consist of metal layers. The metal layers may contain a metal element selected from Ru, Co, Mo, W, Pt, Ir, Rh, or Re, or a combination thereof. In some examples, the metal layers may be deposited on the metal surface 403 by exposing the dual damascene interconnect structure 400 to the deposition gas using CVD, PECVD, ALD, or PEALD techniques.

According to other embodiments of the invention, the first metal-containing cap layer 420 may contain or consist of a metal compound cap layer. The metal compound layer may contain a metal element, for example one or more of the abovementioned metal elements, and a dopant. For example, the dopant may be a non-metal dopant selected from P, B, N, F, Cl, Br, Si, Ge, or a combination thereof. In some embodiments, the metal compound cap layer may be deposited on the metal surface 403 by exposure to a deposition gas containing metal-containing precursor vapor and a dopant gas. For example, the dopant gas may contain or consist of a non-metal dopant gas selected from $PH_3$, $BH_3$, $B_2H_6$, $BF_3$, $NF_3$, $NH_3$, $N_2$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$ or $GeCl_4$, or a combination of two or more thereof. In other embodiments, other Si-containing or Ge-containing non-metal dopant gases may be utilized. In one example, the first metal-containing cap layer 420 may contain a metal compound layer formed by depositing metal layers and, thereafter, incorporating a dopant from a dopant gas into a least a portion of the thickness of metal layer to form a metal compound layer. Exemplary non-metal dopants and non-metal dopant gases were described above. In one example, a dopant may be incorporated into at least a portion of the thickness of a metal layer by exposure to a dopant gas in a thermal or plasma-excited process. In another example, a dopant may be incorporated into at least a portion of the thickness of the first metal-containing cap layer 420 by exposure to GCIB comprising a non-metal dopant gas and optionally an inert gas such as Ar or He. In yet another example, one or more non-metal dopants may be incorporated into at least a thickness of the first metal-containing cap layer 420 by exposing the first metal-containing cap layer 420 to a conventional ion implant beam comprising a non-metal dopant gas and optionally an inert gas such as Ar or He.

Although not shown in FIG. 4C, incorporation of a dopant into the first metal-containing cap layer 420 may also result in incorporation of the dopant into the modified dielectric layers surfaces 413,414, into the metallization layer 402 and into the dielectric layer 404.

According to one embodiment of the invention, following the formation of the first metal-containing cap layer 420 depicted in FIG. 4C, the hydrophobic functional group may be removed from the modified dielectric layer surfaces 413, 414. In one example, the hydrophobic functional group may be removed by a heat-treating process under vacuum conditions and optionally in the presence of an inert gas. The inert gas may be selected from $N_2$ gas and the noble gases. Exemplary heat-treating conditions may further include an inert gas pressure in a range from about 1 mTorr to about 100 Torr, or in a range from about 100 m Torr to about 10 Torr, substrate temperature in a range from about 100° C. to about 500° C., or in a range from about 200° C. to about 400° C., and heat-treating times in a range from about 1 min to about 30 minutes, but embodiments of the invention are not limited by these conditions as other heat-treating conditions may be utilized. According to some embodiments of the invention, the substrate temperature during the heat-treating is higher that the substrate temperature during the exposure of the dual damascene interconnect structure 400 to the reactant gas forming the modified dielectric layer surfaces 413,414.

Figure 4D:
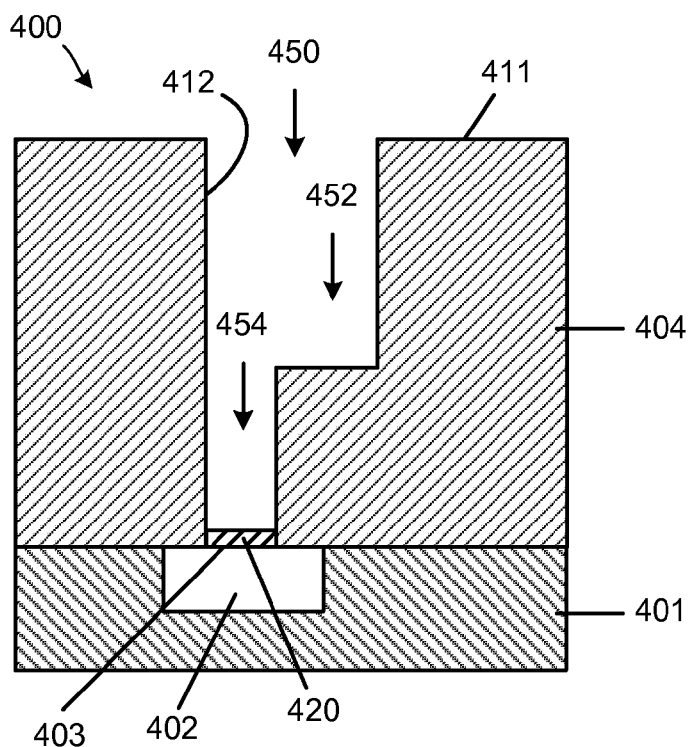

FIG. 4D shows the dual damascene interconnect structure 400 following the heat-treating process where the hydrophobic functional group has been removed from the modified dielectric layer surfaces 413, 414, thus exposing dielectric layer surfaces 411,412.

Figure 4E:
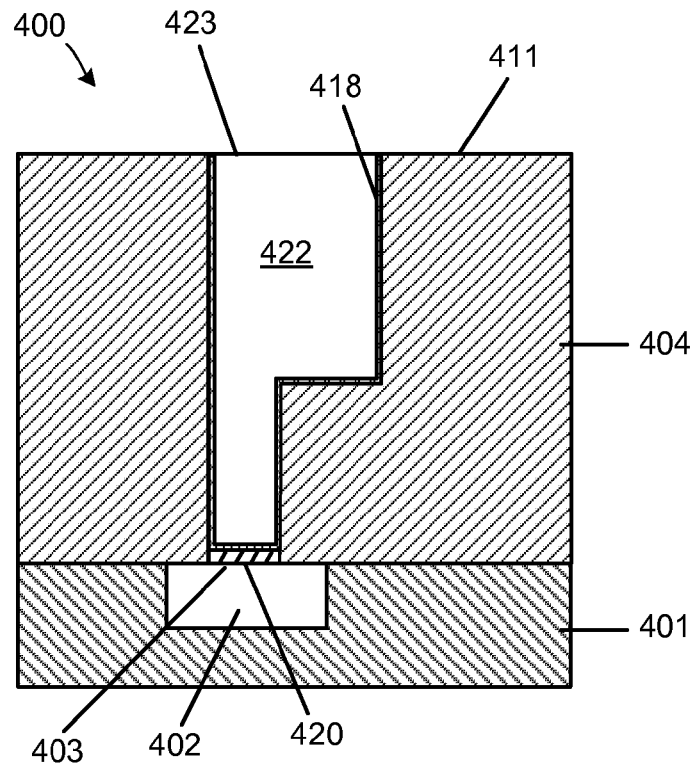

Next, the dual damascene interconnect structure 400 may be further processed. As depicted in FIG. 4E, a barrier layer 418 may formed in the recessed feature 450 and a planarized Cu metal layer 422 formed on the barrier layer 418 in the recessed feature 450. The planarized Cu metal layer 422 contains Cu metal surface 423 and can be formed by filling the recessed feature 450 with bulk Cu metal and removing excess Cu metal using a planarizing process, for example a CMP process. The planarization process further removes the barrier layer 418 from the dielectric layer surface 411.

The barrier layer 418 can, for example, contain a Ta-containing material (e.g., Ta, TaC, TaN, or TaCN, or a combination thereof), a Ti-containing material (e.g., Ti, TiN, or a combination thereof), or a W-containing material (e.g., W, WN, or a combination thereof). In one example, the barrier layer 418 may contain TaCN deposited in a PEALD system using alternating exposures of tertiary amyl imido-tris-dimethylamido tantalum $(Ta(NC(CH_3)_2C_2H_5)(N(CH_3)_2)_3)$ and $H_2$. In another example, the barrier layer 418 may contain a Ru metal layer formed on a Ta-containing layer or on a Ti-containing layer, e.g., Ru/TaN, Ru/TaCN, Ru/TiN, or Ru/TiCN. In yet another example, the barrier layer 418 may contain a mixture of Ru and a Ta-containing material or a mixture of Ru and a Ti-containing material, e.g., RuTaN, RuTaCN, RuTiN, or RuTiCN.

Figure 4F:
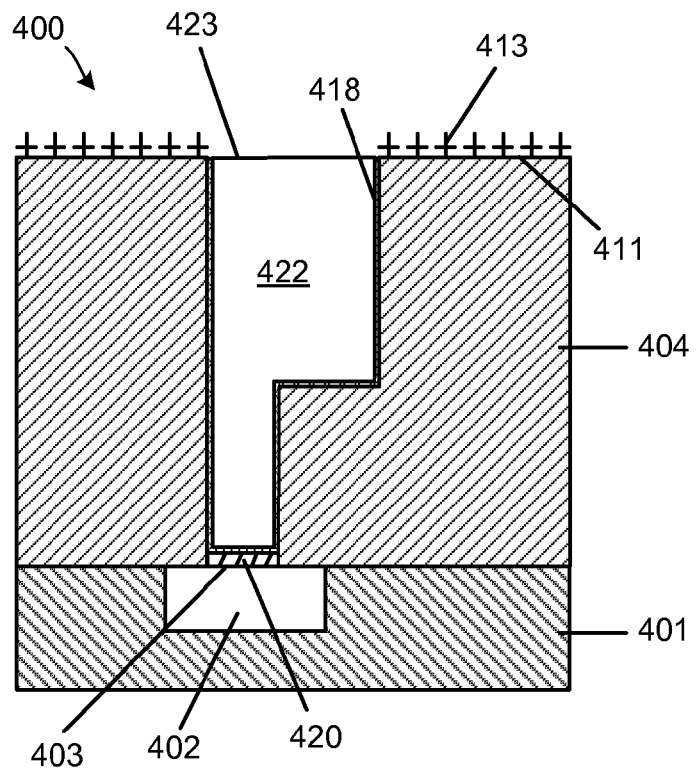

FIG. 4F shows the dual damascene interconnect structure 400 following exposure to a reactant gas that forms modified dielectric layer surface 413. The exposure to the reactant gas substitutes a hydrophilic functional group in the dielectric layer surface 411 with a hydrophobic functional group from the reactant gas.

Although not shown in FIG. 4F, exposure of the dual damascene interconnect structure 400 to the reactant gas may further result in a small amount of adsorbed reactant gas on the Cu metal surface 423. According to one embodiment of the invention, the dual damascene interconnect structure 400 depicted in FIG. 4F may be heat-treated at a temperature that removes adsorbed reactant gas from the Cu metal surface 423 but not from the modified dielectric layer surface 413.

According to one embodiment of the invention, the Cu metal surface 423 on the dual damascene interconnect structure 400 depicted in FIG. 4E or FIG. 4F may be exposed to a reducing gas to reduce oxidized Cu metal on the Cu metal surface 423 and thereby provide a clean Cu metal surface 423 for further processing. For example, the Cu metal surface 423 may be exposed to thermally excited or plasma excited reducing gas containing $H_2$, $NH_3$, $N_2$, $NH(CH_3)_2$, $N_2H_4$, or $N_2H_3CH_3$, or a combination thereof.

Figure 4G:
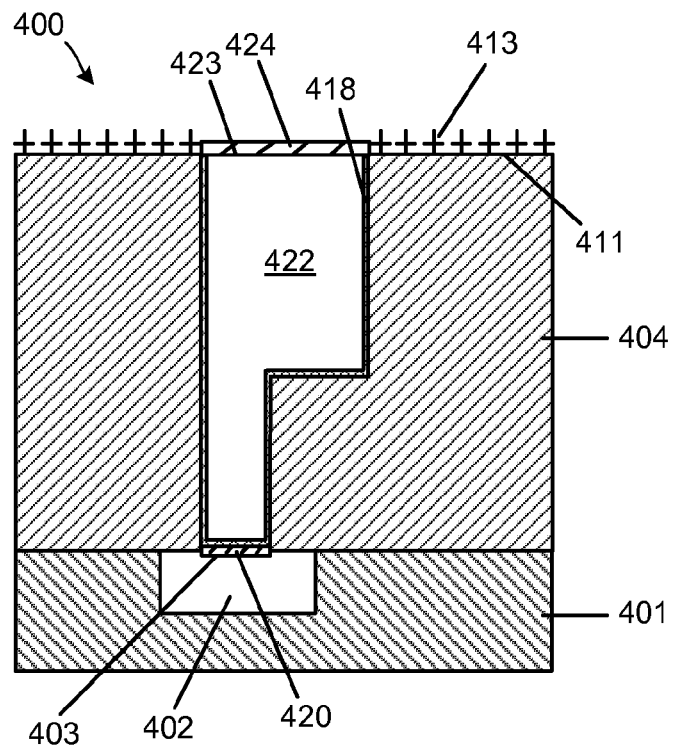

FIG. 4G shows the dual damascene interconnect structure 400 following an exposure to a deposition gas containing metal-containing precursor vapor. The exposure selectively deposits a second metal-containing cap layer 424 onto the Cu metal surface 423, with little or no metal-containing deposition occurring on the modified dielectric layer surface 413 due to lack of adsorption sites for the metal-containing precursor and blocking effects of the hydrophobic functional group on the modified dielectric layer surface 413. In one example, an average thickness of the second metal-containing cap layer 424 can be between 2 angstrom and 200 angstrom, for example about 2, 5, 10, 15, 20, 30, 40, 50, 100, or 200 angstrom. In some examples, the second metal-containing cap layer 424 may have an average thickness between 2 and 5 angstrom. However, embodiments of the invention are not limited to those thicknesses and a second metal-containing cap layer 424 that is thicker than 200 angstrom may be formed. According to one embodiment, a surface coverage of the second metal-containing cap layer 424 on the Cu metal surface 423 may be incomplete with gaps that expose the Cu metal surface 423.

According to some embodiment of the invention, the second metal-containing cap layer 424 may contain or consist of metal layers. The metal layers may contain a metal element selected from Ru, Co, Mo, W, Pt, Ir, Rh, or Re, or a combination thereof. In some examples, the metal layers may be deposited on the Cu metal surface 423 by exposing the dual damascene interconnect structure 400 to the deposition gas using CVD, PECVD, ALD, or PEALD techniques.

According to other embodiments of the invention, the second metal-containing cap layer 424 may contain or consist of a metal compound cap layer. The metal compound layer may contain a metal element, for example one or more of the abovementioned metal elements, and a dopant. For example, the dopant may be a non-metal dopant selected from P, B, N, F, Cl, Br, Si, Ge, or a combination thereof. In some embodiments, the metal compound cap layer may be deposited on the Cu metal surface 423 by exposure to a deposition gas containing metal-containing precursor vapor and a dopant gas. For example, the dopant gas may contain or consist of a non-metal dopant gas selected from $PH_3$, $BH_3$, $B_2H_6$, $BF_3$, $NF_3$, $NH_3$, $N_2$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$ or $GeCl_4$, or a combination of two or more thereof. In other embodiments, other Si-containing or Ge-containing non-metal dopant gases may be utilized. In one example, a metal compound layer may be formed by depositing a metal cap layer and, thereafter, incorporating a dopant from a dopant gas into a least a portion of the thickness of a metal layer to form a metal compound cap layers. Exemplary non-metal dopants and non-metal dopant gases were described above. In one example, a dopant may be incorporated into at least a portion of the thickness of a metal layer by exposure to a dopant gas in a thermal or plasma-excited process. In another example, a dopant may be incorporated into at least a portion of the thickness of a metal layer by exposure to GCIB comprising a non-metal dopant gas and optionally an inert gas such as Ar or He. In yet another example, one or more non-metal dopants may be incorporated into at least a thickness of the metal layer by exposing the metal cap layers to a conventional ion implant beam comprising a non-metal dopant gas and optionally an inert gas such as Ar or He.

Although not shown in FIG. 4G, incorporation of a dopant into the second metal-containing cap layer 424 may also result in incorporation of the dopant into the modified dielectric layers surface 413 and into the Cu metal layer 422.

According to one embodiment of the invention, following the formation of the second metal-containing cap layer 424 depicted in FIG. 4G, the hydrophobic functional group may be removed from the modified dielectric layer surface 413. In one example, the hydrophobic functional group may be removed by a heat-treating process under vacuum conditions and optionally in the presence of an inert gas. The inert gas may be selected from $N_2$ gas and the noble gases. Exemplary heat-treating conditions may further include an inert gas pressure in a range from about 1 mTorr to about 10 Torr, or in a range from about 100 m Torr to about 10 Torr, substrate temperature in a range from about 100° C. to about 500° C., or in a range from about 200° C. to about 400° C., and heat-treating times in a range from about 1 min to about 30 minutes, but embodiments of the invention are not limited by these conditions as other heat-treating conditions may be utilized. According to some embodiments of the invention, the substrate temperature during the heat-treating is higher that the substrate temperature during the exposure of the dual damascene interconnect structure 400 to the reactant gas forming the modified dielectric layer surface 413.

Figure 4H:
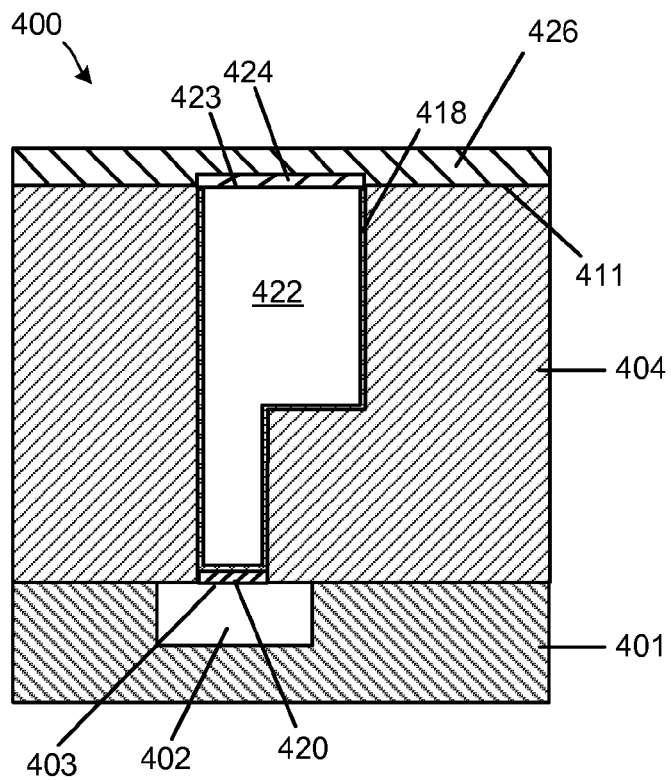

FIG. 4H shows the dual damascene interconnect structure 400 following further processing. The further processing includes a heat-treating process where the hydrophobic functional groups have been removed from the modified dielectric layer surface 413 and a dielectric diffusion barrier layer 426 formed on the second metal-containing 424 and on the dielectric layer surfaces 411. The dielectric diffusion barrier layer 426 can, for example, contain SiN, SiC, or SiCN.

Figure 4I:
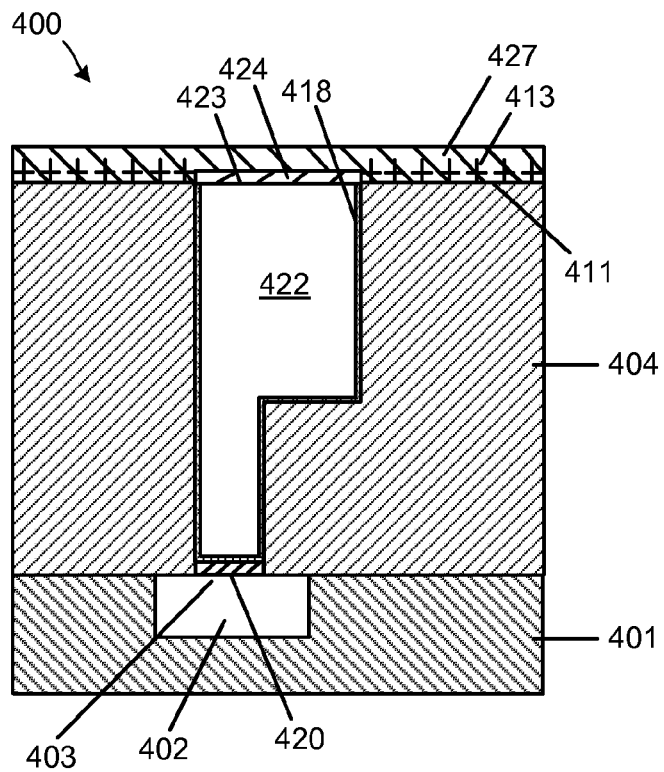

According to another embodiment of the invention, the heat-treating step depicted may be omitted and a second dielectric diffusion barrier layer 427 can be formed on the second metal-containing cap layer 424 and on the modified dielectric layer surface 413. This is depicted in FIG. 4I.

According to yet other embodiment of the invention, the hydrophobic functional group may be removed from the modified dielectric layer surfaces 103 in FIG. 4G, prior to exposing the patterned substrate 1 to a dopant gas.

According to still other embodiments of the invention, the second metal-containing cap layer 424 depicted in FIG. 4G may contain alternating metal layers and metal compound layers. In one example, metal layers may be deposited onto the Cu surfaces 423 and metal compound layers may deposited onto the metal layers. In another example, metal compound layers may be deposited onto the Cu metal surfaces 423 and metal layers deposited onto the metal compound cap layers. The alternating depositions of metal layers and metal compound layers may be repeated a plurality of times.

In one example, the second metal-containing cap layer 424 may contain or consist of Ru metal and the barrier layer 418 may contain a Ru metal adhesion layer in direct contact with the Cu metal layer 422. Thus the portion of the Cu metal layer 422 shown in FIGS. 4G-4I may be encapsulated by Ru metal.

Figure 6:
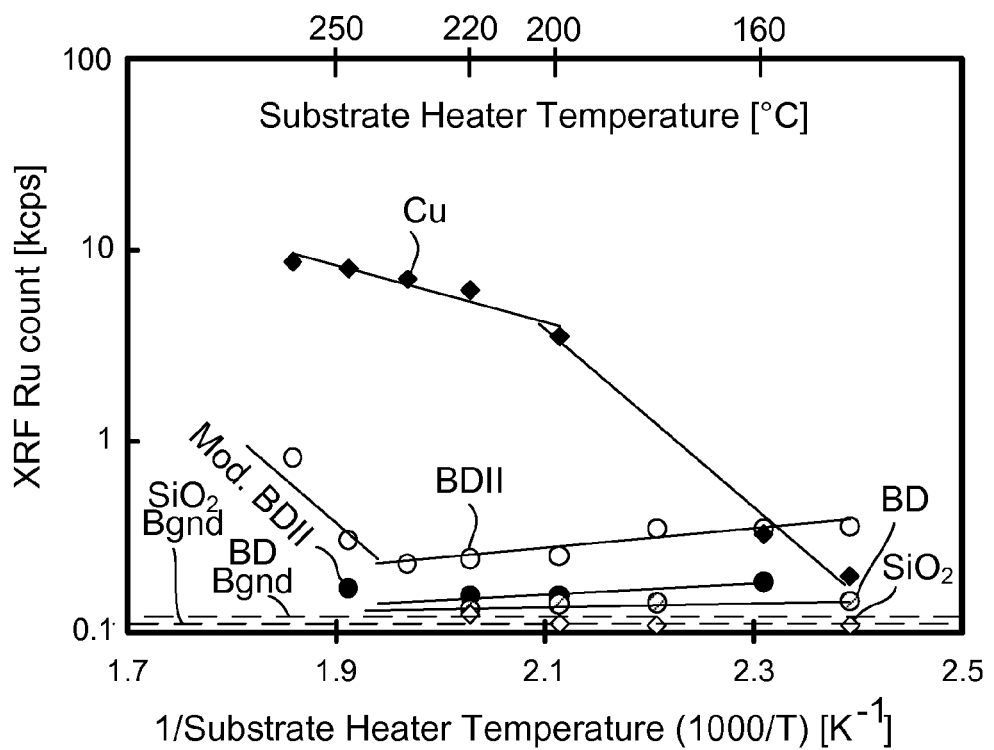
FIG. 6 shows relative Ru metal deposition on different materials as a function of surface preparation and substrate heater temperature.

FIG. 6 shows relative Ru metal deposition on different materials as a function of surface preparation and substrate heater temperature. The different materials included Cu metal, BDII and BD low-k dielectric materials, modified BDII low-k dielectric material, and $SiO_2$. The modified BDII low-k dielectric material was prepared by exposing BDII material to a reactant gas containing trimethylsilane dimethylamine (TMSDMA). The different materials were exposed to a deposition gas containing $Ru_3(CO)_{12}$ vapor and CO carrier gas for 60 seconds at substrate heater temperatures between about 150° C. and about 260° C., and then analyzed using X-ray fluorescence (XRF). The substrate temperatures were estimated to be between 5° C. and 20° C. lower than he substrate heater temperatures. FIG. 6 shows that the deposition rate of Ru metal on the Cu metal surfaces at substrate heater temperatures above about 160° C. is much greater than on the non-metal materials surfaces. In particular, Ru metal deposited on the different materials decreased as: Cu metal>BDII>modified BDII>BD>$SiO_2$. This demonstrates that modifying BDII by exposure to the reactant gas may be used to improve selective deposition on Cu metal surfaces relative to on BDII. Examples of Ru metal deposition in a thermal CVD process using a deposition gas containing $Ru_3(CO)_{12}$ vapor and CO carrier gas are described by Suzuki et al. in U.S. Pat. No. 7,270,848, titled "METHOD FOR INCREASING DEPOSITION RATES OF METAL LAYERS FROM METAL-CARBONYL PRECURSORS", issued on Sep. 18, 2007; by Suzuki in U.S. Pat. No. 7,279,241, titled "METHOD AND DEPOSITION SYSTEM FOR INCREASING DEPOSITION RATES OF METAL LAYERS FROM METAL-CARBONYL PRECURSORS", issued on Oct. 9, 2007; by Suzuki in United States Patent Application Publication No. 20090065939, titled "METHOD FOR INTEGRATING SELECTIVE RUTHENIUM DEPOSITION INTO MANUFACTURING OF A SEMICONDUCTOR DEVICE", published on Mar. 12, 2009; and by Suzuki et al. in U.S. patent application Ser. No. 12/018,074, titled "METHOD FOR INTEGRATING SELECTIVE LOW-TEMPERATURE RUTHENIUM DEPOSITION INTO COPPER METALLIZATION OF A SEMICONDUCTOR DEVICE", filed on Jan. 22, 2008. The entire contents of these documents are incorporated herein by reference.

Figure 7:
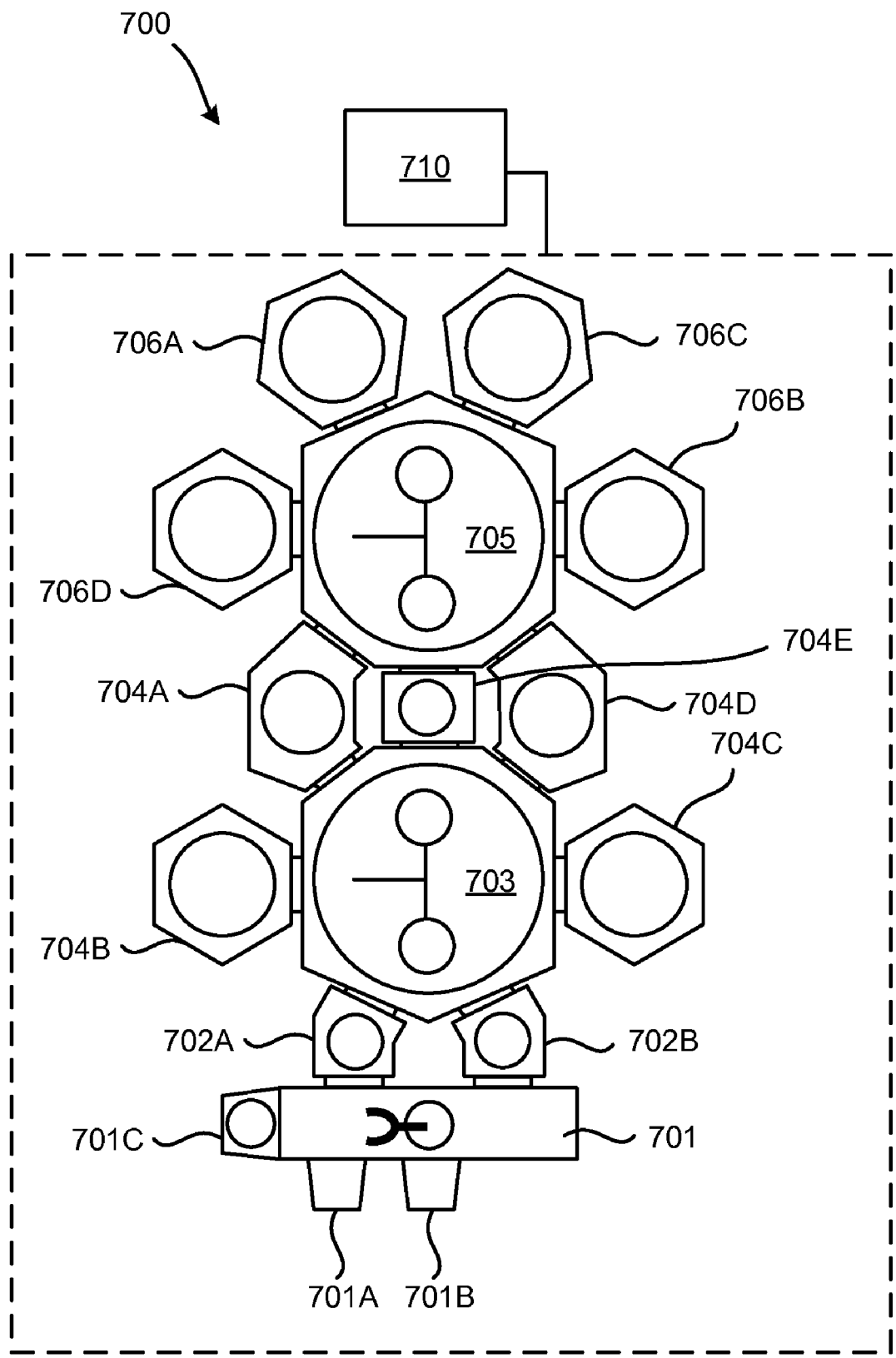
FIG. 7 is a schematic diagram of a vacuum processing tool for performing integrated processing according to embodiments of the invention.

FIG. 7 is a schematic diagram of a vacuum processing tool for performing integrated processing according to embodiments of the invention. The vacuum processing tool 700 contains a substrate (wafer) transfer system 701 that includes cassette modules 701A and 701B, and a substrate alignment module 701C. Load-lock chambers 702A and 702B are coupled to the substrate transfer system 701. The substrate transfer system 701 is maintained at atmospheric pressure but a clean environment is provided by purging with an inert gas.

The load lock chambers 702A and 702B are coupled to a substrate transfer system 703. The substrate transfer system 503 may be maintained at a very low base pressure (e.g., $5 \times 10^{-8}$ Torr, or lower), using a turbomolecular pump (not shown). The substrate transfer system 703 includes a substrate transfer robot and is coupled to degassing systems 704A and 704D, and processing systems 704B and 704C configured for exposing the patterned substrates to a reactant gas containing hydrophobic functional groups.

Furthermore, the substrate transfer system 703 is coupled to a substrate transfer system 705 through substrate handling chamber 704E. As in the substrate transfer system 703, the substrate transfer system 705 may be maintained at a very low base pressure (e.g., $5 \times 10^{-8}$ Torr, or lower), using a turbomolecular pump (not shown). The substrate transfer system 705 includes a substrate transfer robot. Coupled to the substrate transfer system 705 are processing systems 706B and 706D configured for treating the patterned substrates with a reducing gas, processing system 706A configured for exposing the patterned substrates to a deposition gas to deposit metal-containing cap layers onto the substrates, and processing system 706C for optionally exposing metal-containing cap layers to a dopant gas.

According to one embodiment of the invention, the processing system 706A may be a Ru CVD system configured for utilizing a deposition gas containing $Ru_3(CO)_{12}$ and CO for depositing Ru metal cap layers.

Processing systems 706B and 706D may be configured for exposing the substrates to thermally excited or plasma excited reducing gas containing $H_2$, $NH_3$, $N_2$, $NH(CH_3)_2$, $N_2H_4$, or $N_2H_3CH_3$, or a combination thereof.

The vacuum processing tool 700 includes a controller 710 that can be coupled to and control any or all of the processing systems and processing elements depicted in FIG. 7 during the integrated substrate processing. Alternatively, or in addition, controller 710 can be coupled to one or more additional controllers/computers (not shown), and controller 710 can obtain setup and/or configuration information from an additional controller/computer. The controller 710 can be used to configure any or all of the processing systems and processing elements, and the controller 710 can collect, provide, process, store, and display data from any or all of the processing systems and processing elements. The controller 710 can comprise a number of applications for controlling any or all of the processing systems and processing elements. For example, controller 710 can include a graphic user interface (GUI) component (not shown) that can provide easy to use interfaces that enable a user to monitor and/or control one or more processing systems processing elements.

The controller 710 can include a microprocessor, memory, and a digital I/O port capable of generating control voltages sufficient to communicate, activate inputs, and exchange information with the vacuum processing tool 700 as well as monitor outputs from the vacuum processing tool 700. For example, a program stored in the memory may be utilized to activate the inputs of the vacuum processing tool 700 according to a process recipe in order to perform integrated substrate processing. The controller 710 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 710 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 710, for driving a device or devices for implementing the invention, and/or for enabling the controller 710 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 710 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 710.

The controller 710 may be locally located relative to the vacuum processing tool 700, or it may be remotely located relative to the vacuum processing tool 700. For example, the controller 710 may exchange data with the vacuum processing tool 700 using at least one of a direct connection, an intranet, the Internet and a wireless connection. The controller 710 may be coupled to an intranet at, for example, a customer site (i.e., a device maker, etc.), or it may be coupled to an intranet at, for example, a vendor site (i.e., an equipment manufacturer). Additionally, for example, the controller 710 may be coupled to the Internet. Furthermore, another computer (i.e., controller, server, etc.) may access, for example, the controller 710 to exchange data via at least one of a direct connection, an intranet, and the Internet. As also would be appreciated by those skilled in the art, the controller 710 may exchange data with the vacuum processing tool 700 via a wireless connection.

As those skilled in the art will readily recognize, embodiments of the invention may not require the use of all the processing systems of the vacuum processing tool 700 depicted in FIG. 7. As described above, the vacuum processing tool 700 may contain two processing system (e.g., processing systems 704B and 704C) configured for performing the same or similar processing. This may be done in order to increase wafer throughput of the vacuum processing tool 700. Thus, some embodiments of the invention may include the use of less than all the processing systems depicted in FIG. 7.

Figure 5:
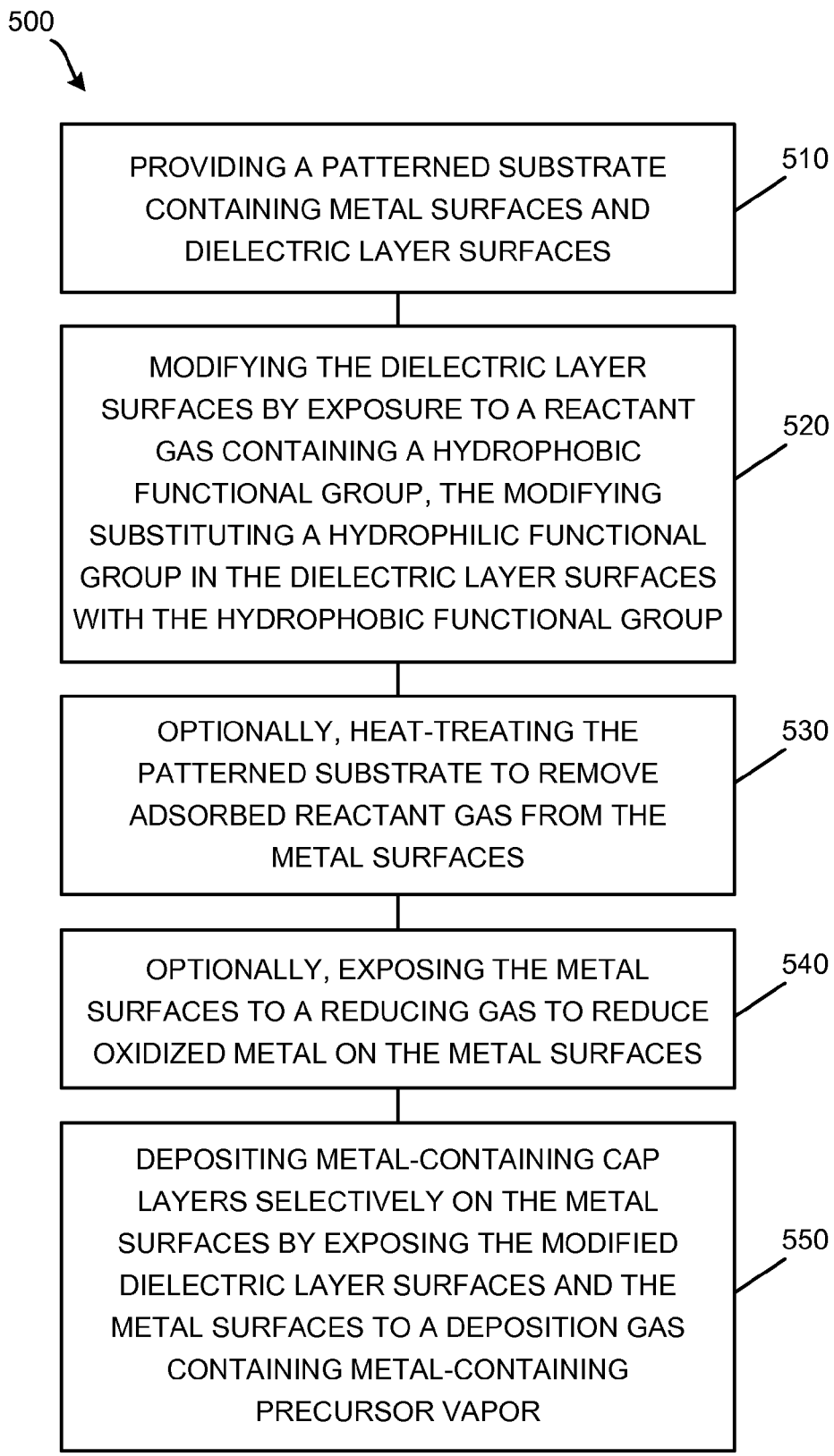
FIG. 5 is a process flow diagram for forming metal-containing cap layers on a patterned substrate according to an embodiment of the invention.

FIG. 5 is a process flow diagram for forming metal-containing cap layers on a patterned substrate according to an embodiment of the invention. Referring also to FIG. 7, the process 500 includes, at 510, providing a patterned substrate containing metal surfaces and dielectric layer surfaces in a vacuum processing tool 700. According to one embodiment, the patterned substrate may contain a dielectric layer having dielectric layer surfaces, where the patterned substrate further contains a metal surface inside recessed features in the dielectric layer. According to another embodiment, the metal surfaces may be located on planarized metal layers filling recessed features in a dielectric layer. The patterned substrate may be loaded using cassette modules 701A and 701B, aligned in the substrate alignment module 701C, and pumped down using load lock chambers 702A or 702B. The patterned substrate may be introduced into degassing systems 704A or 704D by the substrate transfer system 703. Thereafter, the patterned substrate may optionally transferred by the substrate transfer system 705 into processing systems 706D or 706B for removing residues or contaminants such as oxidized metal from the patterned substrate by exposure to thermally excited or plasma excited reducing gas containing $H_2$, $NH_3$, $N_2$, $NH(CH_3)_2$, $N_2H_4$, or $N_2H_3CH_3$, or a combination thereof.

At 520, the patterned substrate is exposed to a reactant gas containing hydrophobic functional groups in processing systems 704B or 704C. The exposure modifies the dielectric layer surfaces by substituting a hydrophilic functional group on the dielectric layer surfaces with the hydrophobic functional group. The reactant gas may include a silicon-containing reactant gas containing an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof.

At 530, the patterned substrate may optionally be heat-treated, for example in the degassing systems 704A or 704D or in the processing systems 706D or 706B to remove any adsorbed reactant gas from the metal surfaces on the patterned substrate.

At 540, the patterned substrate may optionally be exposed to a reducing gas in the processing systems 706D or 706B to reduce oxidized metal on the metal surfaces.

At 550, metal-containing cap layers are selectively deposited on the metal surfaces of the patterned substrate in the processing system 706A by exposing the modified dielectric layer surfaces and the metal surfaces to a deposition gas containing metal-containing precursor vapor. The metal-containing precursor vapor can contain a metal element selected from Pt, Au, Ru, Co, W, Rh, Ir, or Pd, or a combination of two or more thereof. In some embodiments, the deposition gas may further include a non-metal dopant gas selected from $PH_3$, $BH_3$, $B_2H_6$, $BF_3$, $NF_3$, $NH_3$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$, or $GeCl_4$, or a combination of two or more thereof.

Alternately, metal cap layers may be formed on the metal surfaces of the patterned substrate by exposing the modified dielectric layer surfaces and the metal surfaces to the metal-containing precursor vapor in the processing system 706A to deposit metal layers selectively on the metal surfaces, where the metal layers contain Pt, Au, Ru, Co, W, Rh, Ir, or Pd, or a combination of two or more thereof. Thereafter, the patterned substrate may be transferred to the processing system 706C to incorporate a dopant into the metal layers by exposing the deposited metal layers to a dopant gas selected from $PH_3$, $BH_3$, $B_2H_6$, $BF_3$, $NF_3$, $NH_3$, $N_2$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $SiCl_2Cl_6$, $SiH_3F$, $SiH_2F$, $SiHF_3$, $SiF_4$, $Si_2F_6$, $GeH_4$, or $GeCl_4$, or a combination of two or more thereof. According to one embodiment of the invention, processing system 706C may be a GCIB processing system.

Next, the patterned substrate may be returned to the substrate transfer system 705, the substrate handling chamber 704E, the substrate transfer system 703, the load lock chambers 702A or 702B, and returned to the cassette modules 701A or 701B and removed from the vacuum processing tool 700 for further processing.

According to another embodiment, one or more external processing systems configured for exposing patterned substrates to a reactant gas containing hydrophobic functional groups may be decoupled from the vacuum processing tool 700. In one example, patterned substrates may be exposed to a reactant gas in the one or more external processing systems and, thereafter, exposed to air and transferred to the vacuum processing tool 700 for further processing, including depositing metal-containing cap layers on the patterned substrates.

A plurality of embodiments for integrating metal-containing cap layers into manufacturing of semiconductor devices to improve electromigration and stress migration in Cu metallization has been disclosed. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
    providing a patterned substrate containing metal surfaces and dielectric layer surfaces;
    modifying the dielectric layer surfaces by exposure to a reactant gas containing a hydrophobic functional group, the modifying substituting a hydrophilic functional group in the dielectric layer surfaces with the hydrophobic functional group; and
    depositing metal-containing cap layers selectively on the metal surfaces by exposing the modified dielectric layer surfaces and the metal surfaces to a deposition gas containing metal-containing precursor vapor, wherein the depositing comprises:
    exposing the modified dielectric layer surfaces and the metal surfaces to the metal-containing precursor vapor to deposit metal layers selectively on the metal surfaces, wherein the metal-containing precursor vapor contains a metal element selected from platinum (Pt), gold (Au), ruthenium (Ru), cobalt (Co), tungsten (W), rhodium (Rh), iridium (Ir), or palladium (Pd), or a combination of two or more thereof, and
    incorporating a dopant into the metal layers by exposing the deposited metal layers to a dopant gas selected from $PH_3$, $BH_3$, $B_2H_6$, $BF_3$, $NF_3$, $NH_3$, $N_2$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$, or $GeCl_4$, or a combination of two or more thereof, wherein the incorporating comprises exposing the metal layers to a gas cluster ion beam (GCIB) or an ion implant beam containing the dopant gas.

2. The method of claim 1, wherein the reactant gas comprises a silicon-containing gas selected from an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof.

3. The method of claim 1, wherein the modifying further comprises:
    adsorbing the reactant gas on the metal surfaces; and
    heat-treating the patterned substrate at a temperature that selectively removes the adsorbed reactant gas from the metal surfaces without removing the hydrophobic functional groups from the modified dielectric layer surfaces.

4. The method of claim 1, further comprising:
    exposing the metal surfaces to a reducing gas to reduce oxidized metal on the metal surfaces.

5. The method of claim 1, further comprising:
    following the exposing of the modified dielectric layer surfaces and the metal surfaces to the metal-containing precursor vapor and prior to the incorporating, removing the hydrophobic functional group from the modified dielectric layer surfaces.

6. The method of claim 1, wherein the providing comprises:
    providing a patterned substrate containing a dielectric layer having the dielectric layer surfaces, the patterned substrate further containing metal surfaces inside recessed features in the dielectric layer.

7. The method of claim 1, wherein the metal surfaces are located on planarized metal layers filling recessed features in a dielectric layer.

8. A method of forming a semiconductor device, comprising:
- providing a patterned substrate containing metal surfaces and dielectric layer surfaces;
- modifying the dielectric layer surfaces by exposure to a reactant gas containing a hydrophobic functional group, the modifying substituting a hydrophilic functional group in the dielectric layer surfaces with the hydrophobic functional group; and
- depositing metal-containing cap layers selectively on the metal surfaces by exposing the modified dielectric layer surfaces and the metal surfaces to a deposition gas containing metal-containing precursor vapor and a non-metal dopant gas, wherein the modified dielectric layer surfaces and the metal surfaces are contemporaneously exposed to the metal-containing precursor vapor and the non-metal dopant gas, and wherein the metal-containing precursor vapor contains a metal element selected from platinum (Pt), gold (Au), ruthenium (Ru), cobalt (Co), tungsten (W), rhodium (Rh), iridium (Ir), or palladium (Pd), or a combination of two or more thereof, and the dopant gas is selected from $PH_3$, $BH_3$, $B_2H_6$, $BF_3$, $NF_3$, $NH_3$, $N_2$, $N_2H_4$, $PF_3$, $PBr_3$, $BCl_3$, $BI_3$, $SiH_4$, $Si_2H_6$, $SiH_3Cl$, $SiH_2Cl_2$, $SiHCl_3$, $SiCl_4$, $Si_2Cl_6$, $SiH_3F$, $SiH_2F$, $SiHF_3$, $SiF_4$, $Si_2F_6$, $GeH_4$, or $GeCl_4$, or a combination of two or more thereof.

9. The method of claim 8, wherein the metal-containing cap layers contain metal compound layers having the metal element and a non-metal dopant element selected from phosphorus (P), boron (B), nitrogen (N), fluorine (F), bromine (Br), silicon (Si), or germanium (Ge), or a combination of two or more thereof.

\* \* \* \* \*